United States Patent [19]

Kawano et al.

[11] Patent Number: 5,363,867
[45] Date of Patent: Nov. 15, 1994

[54] ARTICLE STORAGE HOUSE IN A CLEAN ROOM

[75] Inventors: Hitoshi Kawano; Atsushi Okuno; Masanori Tsuda; Mitsuhiro Hayashi; Teppei Yamashita; Masanao Murata; Tsuyoshi Tanaka; Teruya Morita; Akio Nakamura, all of Ise, Japan

[73] Assignee: Shinko Electric Co., Ltd., Tokyo, Japan

[21] Appl. No.: 6,318

[22] Filed: Jan. 21, 1993

[30] Foreign Application Priority Data

Jan. 21, 1992 [JP] Japan .................................. 4-008663
Jan. 27, 1992 [JP] Japan .................................. 4-012311

[51] Int. Cl.⁵ .............................................. B08B 3/00
[52] U.S. Cl. .................................... 134/95.2; 34/218; 141/98
[58] Field of Search ............... 141/85, 383, 98; 34/22, 34/218, 219, 225, 227, 232, 233, 235, 224; 15/302, 303; 134/61, 94.1, 95.1, 95.2

[56] References Cited

U.S. PATENT DOCUMENTS 4,724,874 2/1988 Parikh et al. .......................... 141/98

FOREIGN PATENT DOCUMENTS 60-143623 7/1985 Japan .
1-41561 9/1989 Japan .
90-119 3/1991 Japan .

OTHER PUBLICATIONS

Article entitled "Super LSI Ultra Clean Technology Symposium", Tadahiro OHMI et al, published Nov. 19, 1990, pp. 63-80, (Japanese Language article with English translation incorporated therein).

Primary Examiner—Henry A. Bennett
Attorney, Agent, or Firm—Flynn, Thiel, Boutell & Tanis

[57] ABSTRACT

An article storage house in a clean room for airtightly accommodating a wafer cassette, etc. in which the wafer cassette carried in from the outside of an article carry-in/out portion is accommodated into a container by an automatic article delivery unit disposed in the article carry-in/out portion or it is carried in the article storage house while it is accommodated in the container and is stored in sections of the article storage house. An inert gas purge mechanism and an automatic container cleaning portion are disposed in the automatic article delivery unit or each section.

21 Claims, 26 Drawing Sheets

ARTICLE STORAGE HOUSE IN A CLEAN ROOM

BACKGROUND OF THE INVENTION

1. Field of the Invention

The present invention relates to an article storage house, i.e. an article storage house in a clean room which temporarily stores semiconductor wafers, crystal display substrates, reticles, disks, etc. in a clean room.

2. Prior Art

There is an article storage house in a clean room as disclosed in Japanese Patent Laid-Open Publication No. 1-41561. The article storage house has an article storage chamber, and article storage shelves provided in the article storage chamber and having a plurality of sectioned accommodating spaces which are arranged vertically and laterally and a carry-in/out unit having a carry-in/out mechanism which can freely travel on a given route laid along a central passage between the article storage shelves arranged at both sides in the article storage chamber and can move vertically and laterally.

The article storage house of this type has an air supply unit and an air filter wherein air supplied from the air supply unit is cleaned by the air filter and it is blown from the rear portions of the article storage shelves toward the carry-in/out unit whereby dust is prevented from floating and staying on the article storage shelves.

Furthermore, since the carry-in/out unit has an elevator guiding unit for guiding the carry-in/out mechanism and an elevator driving unit which are mounted on a self-advancing carriage, dust is generated by abrasion between the elevator guide unit and the elevator driving unit and the self-advancing carriage. There occurs such a problem that the dust so generated is neither drawn toward the floor nor removed from the floor but moves toward the article storage shelves so that the dust adheres to the semiconductor wafer, etc. To prevent such problem, there are provided a cover for covering the entire of the elevator guiding unit and elevator driving unit mounted on the self-advancing carriage of the carry-in/out unit and an air drawing unit mounted on the lower surface of the self-advancing carriage for drawing the dust generated in the cover and removing the dust and discharging it toward the floor.

As mentioned above, there is formed a clean air current which flows from the rear portions of the article storage shelves toward the central passage between the article storage shelves disposed at both sides in the conventional article storage house in a clean room so that the dust is prevented from adhering to articles on the article storage shelves (semiconductor wafers accommodated in a wafer cassette).

However, in the conventional article storage house, there are following problems. That is, the article storage house should have a large-scale clean air supply system equipped with a high-performance filter or a circulation system since the article storage house is structured to keep the entire inside thereof to be in a highly clean air atmosphere. Furthermore, the inside of the article storage house should be structured and shaped so as to keep the entire thereof clean. Still furthermore, the components of the article storage house should meet the requirements as set forth above. Accordingly, the conventional article storage house becomes large-scale as a whole and costs high and is inferior in the maintenance thereof.

In case of a power failure, the clean air supply system or the circulation system stops in the operation thereof, which generates such problems that cleanliness of the entire article storage house is lowered and the maintenance of the system can not be made free since the contamination, which is caused by the trouble of the maintenance of the carry-in/out unit and other components, spreads over the entire article storage house.

As the semiconductor IC has progressed recently in its degree of high integration, there has occurred the problem of the formation of the oxide film caused by the natural oxidation of the semiconductor IC during the storage thereof.

FIGS. 28 and 29 appear in a thesis entitled "Super LSI Ultra Clean Technology Symposium" published Nov. 19, 1990. FIG. 28 shows the relation between the thickness of an oxide film and the time involved in the formation of the oxide film which is formed by the natural oxidation of the silicon semiconductor wafer. FIG. 29 shows the relation between the resistivity of the silicon semiconductor wafer and an air-exposure time when the silicon semiconductor wafer is exposed to the atmosphere so that the natural oxide film is formed thereon and is subjected to an epitaxial growth. According to this thesis, if the silicon semiconductor wafer is exposed to the atmosphere, the rate of growth of the oxide film is increased after the lapse of 100 to 200 minutes as illustrated in FIG. 28 and the resistivity is sharply increased after the lapse of about 50 minutes in case of non-cleaning state (in case of forming the natural oxide film).

In order to prevent the growth of the natural oxide film, the wafer should be moved or carried in an inert gas atmosphere (e.g. $N_2$ gas or dry air). The inert gas atmosphere should have $O_2$ concentration which is less than 10 ppm and $H_2O$ concentration of which is less than 100 ppm.

Accordingly, the treatment of the semiconductor, which has been made conventionally in a specially designed clean room, has been made in a mechanical interface unit, which is provided in such clean room as disclosed in, e.g. Japanese Patent Laid-Open Publication No. 60-143623 or in the mechanical interface unit while the same unit is in the inert gas such as $N_2$ gas etc. atmosphere.

However, there occurs such a problem that the natural oxide film is formed in the article storage house because the semiconductor wafer is stored normally during several times to several days in the article storage house.

To overcome this problem, the applicant filed the patent application for "a wafer storage house" under No. 3-9401 wherein a wafer storage chamber can be always filled with inert gas inside the wafer storage chamber so that the natural oxide film is restrained from growing on the surface of the semiconductor wafer. FIG. 23 shows this wafer storage house.

In FIG. 23, a wafer storage house 300 has a double-walled structure, i.e. an outer wall 311 and an inner wall 312 wherein a space 313 is defined between the outer and inner walls 311 and 312 and a wafer storage chamber 314 which is defined in a space surrounded by the inner wall 312. The wafer storage chamber 314 has a filter wall 314A at the ceiling thereof through which inert gas is filtered and a drawing wall 314B at the bottom thereof from which the inert gas is drawn. The outer wall 311 hat a discharge port 311B lower portion of the drawing wall 314B. The wafer storage chamber 314 has wafer storage shelves 315 and 316 at the right and left walls thereof and fluid passages 317 and 318 which are formed between the rear portions of the wafer storage shelves 315 and 316 and the inner wall 312. The wafer storage shelves 315 and 316 have respectively a plurality of sectioned shelves 319 and filters 320 which partition each sectioned shelve 319 and the fluid passage 317 or 318. The wafer storage shelves have spaces 321 and 322 at the bottom portions thereof and the spaces 321 and 322 communicate with the fluid passages 317 and 318. A circulation pump 323 is disposed in the space 321. A circulation pump, not shown, is disposed in the space 322. There are provided a first path box 330 at a first carry-in/out opening and a second path box 331 at a second carry-in/out opening. The first and second path boxes 330 and 331 have respectively filters 330A and 331A at the ceilings thereof and discharge ports 330B and 331B at the bottom walls thereof.

Designated at 340 is a gas storage tank (in this case $N_2$ gas cylinder) for storing inert gas therein (in this case $N_2$ gas) and 350 is a flow control unit. A first gas supply pipe 341 extends from the storage tank 340 to the ceiling of the article storage house 300 and opens into the space 313 between the outer and inner walls 311 and 312. Designated at 351 is a variable flow valve. A second gas supply pipe 342 extends from the storage tank 340 to the upper portion of the first path box 330. Designated at 352 is a first ON/OFF valve. A third gas supply pipe 343 extends from the storage tank 340 to the upper portion of the second path box 331. Designated at 353 is a second ON/OFF valve and 354, 355 and 356 are normally closed valves.

A first oxygen concentration meter 361 measures the oxygen concentration in the article storage house 300. A second oxygen concentration meter 362 measures the oxygen concentration in the first path box 330 and a third oxygen concentration meter 363 measures the oxygen concentration in the second path box 331.

A flow control unit 350 receives signals representing oxygen concentration measured by the first to third oxygen concentration meters 361, 362 and 363 and monitors such oxygen concentration to thereby control the degree of opening of the variable flow valve 351 in response the difference between the valve measured by the first oxygen concentration meter 361 and the reference value of the same. The flow control unit 350 opens the first and second ON/OFF valves until the values measured by sensors 362 and 363 reach prescribed values or during given time.

A stacker crane 370 travels on rails laid on the floor of the central passage. Designated at 381 are air blowing fans and 382 are air drawing fans.

In the wafer storage house, the wafer storage chamber can be always filled with inert gas so that the natural oxide film is restrained from growing on the surface of the semiconductor wafer. Furthermore, inert gas current, which directs from the rear portions of the sectioned shelves toward the stacker crane, is generated in the wafer storage chamber so that dust is prevented from adhering to the semiconductor wafer in the sectioned shelves. Air in the entire storage chamber can be replaced by inert gas, namely, the inert gas purge can be performed it, the entire storage chamber.

The applicant filed the application for the invention of the wafer storage house under No. 3-9404 in which sectioned shelves of the wafer storage house are structured to form small rooms in each of which the inert gas purge is performed. This is illustrated in FIG. 24.

In FIG. 24, a wafer storage house is provided with a wafer storage unit 400 having a plurality of box-shaped sectioned rooms 411 which are arranged lengthwise and crosswise and accommodate wafer cassettes therein as shown in FIG. 25. Each of the sectioned rooms 411 has a froth door 420 at the front opening side thereof (the side from which the cassette is taken in and out by the moving/loading unit). Each of the sectioned rooms 411 has a filter 412A which defines a fluid supply passage 413A between a left wall 411A and itself and a filter 412B which defines a fluid supply passage 413B between a right wall 411B and itself wherein both the filters 412A and 412B define a wafer accommodating space 414 therebetween from which the wafer cassettes are taken in and out.

A space 415 for use in piping is defined between the upper and lower sectioned rooms of the wafer storage unit 400 and extends from the left wall 411A to the right wall 411B thereof as shown in FIG. 26. There are provided in the space 415 a gas supply pipe 431A which penetrates the bottom wall 411C of the sectioned room 411 and opens into the fluid supply passage 413A and a gas discharge pipe 431B which penetrates the bottom wall 411C and opens into the fluid supply passage 413B. The gas supply pipe 431A is connected to an inert gas storage tank (such as an $N_2$ gas cylinder, not shown) provided outside the wafer storage unit 400 by way of a valve and the gas discharge pipe 431B opens into the outside of the wafer storage house by way of a discharge valve. A seal member 416 is provided at the periphery of the front door 420 of each sectioned room 411.

As shown in FIG. 27, the front door 420 has shafts 421 and 422 which extend upward and downward from one side thereof in which the shaft 421 is received by a receiving member 417 projecting from the sectioned room 411 and the shaft 422 is connected to a motor 424 by a coupling 423. Four magnetic member pins 441 project from four corners of the front door 420 at the rear surface thereof. Each sectioned room 411 has electromagnetic solenoids 442 therein which attract the magnetic member pins 441. The magnetic member pins 441 and the electromagnetic solenoids 442 constitute automatic lock units. There is a play in the coupling 423.

In the arrangement of the wafer storage house, air in the wafer accommodation spaces 414 of all the sectioned rooms 411 should be replaced by $N_2$ gas before the wafer storage units 400 are used. For this purpose, the motor 424 of the front door 420 is driven to close the front door 420 and to energize the electromagnetic solenoid 442 to thereby operate the lock unit. When the lock unit operates, the magnetic member pins 441 are attracted toward the rear wall side of the wafter accommodating space 414 so that the front door 420 is pressed strong against to contact the opening of the sectioned room 411 by way of the seal member 416, which results in closing the wafer accommodating space 411 airtightly.

Successively, the valve of the gas supply pipe 431A is full open and the discharge valve disposed at the discharge port of the gas discharge pipe 431B. Accordingly, $N_2$ gas is supplied from the inert gas storage tank to the fluid supply passage 413A of the cassette accommodating space 414 by way of the gas supply pipe 431A. The $N_2$ gas so supplied to the fluid supply passage 413A enters the wafer accommodating space 414 by way of the filter 412A so that the wafer accommodating space 414 is filled with the $N_2$ gas. Air occupied the wafer accommodating space 414 passes through the filter 412B and expelled toward the fluid discharge passage 413B and then flows in the gas discharge pipe 431B and finally discharged outside the wafer storage house whereby air in the wafer accommodating space 414 is replaced by the $N_2$ gas. All the valves are closed upon completion of the replacement of air by $N_2$ gas.

Since the concentration of the $N_2$ gas in the wafer accommodating space 414 lowers as time lapses, the $N_2$ gas should be replenished. For this purpose, a flow control unit is provided for controlling the valve in the gas supply pipe 431A. The closing control of the valve may be made by a time control system where the valve is open during a predetermined time in every given time interval or a control system where the concentration of oxygen is monitored and the valve is open when the concentration of oxygen exceeds the prescribed value.

The wafer cassettes are taken in or out from the cassettes accommodating space 414 by unlocking the automatic lock unit of the specified sectioned room 411 and by driving the motor 424 of the front door 420 for thereby opening the front door 420.

In this case, since the wafer accommodating space 411 is in the inert gas atmosphere except the front door 420 is open, the oxide film is restrained from growing on the surface of the semiconductor wafer while the latter is stored in the wafer storage house.

There are such problems in the wafer storage house as disclosed in the Japanese Patent Application No. 3-9401 that firstly a person is likely to suffocate in the wafer storage chamber since the entire wafer storage chamber is in the inert gas atmosphere, secondly if there occurs the necessity of the operations in the wafer storage chamber, it is very troublesome that the person can not enter the chamber unless the gas in the chamber should be discharged and the concentration of oxygen in the chamber is measured and it is confirmed that the suffocation is not likely to occur, and thirdly there remains anxious for the likelihood of suffocation even in the clean room when the gas in the chamber is discharged if the clean room is poorly ventilated.

It takes a long time for the chamber to be filled with a highpure inert gas after the inert gas in the wafer storage chamber is once discharged, which generates the problem that the natural oxide film starts to grow on the surface of the semiconductor wafer while the semiconductor wafer is stored.

Since the highpure inert gas costs high and it is expelled every time the gas inside the entire storage house is discharged, there occurs the problem that the highpure inert gas is consumed much.

The wafer storage house as disclosed in Japanese Patent Application No. 3-9404 has no problem of suffocation. However, since the inert gas is circulated inside the article storage house, oxygen enters the sectioned room when the inert gas is purged again in case of opening the sectioned room so that the sectioned room is hardly to be maintained in the highpure inert gas atmosphere, which generates the problem that the structure for preventing the inert gas from discharging is very complex in case of opening the door of the sectioned room.

SUMMARY OF THE INVENTION

It is a first object of the present invention to provide an article storage house in a clean room capable of accommodating and storing wafer cassettes in an airtight container without leaving them in a naked state, i.e. in an atmosphere and capable of dispensing with the structure or instruments, implements and apparatus for keeping the inside of the article storage house to be in a highly clean atmosphere or in the inert gas atmosphere. As a result, it is possible to manufacture the small-scale article storage house with low cost and there is no likelihood of contamination of the wafers and the growth of the natural oxide film on the wafers caused by the trouble of the instruments, implements and apparatus and the power failure of these instruments, etc. It is also possible that an operator can perform maintenance of the components of the article storage house freely in the article storage house to thereby greatly improve the reliability thereof.

It is a second object of the present invention to provide an article storage house in a clean room capable of accommodating and storing semiconductor wafers, etc. in the airtight container and capable of preventing the semiconductor wafers, etc. from being contaminated by a particle of dust or by the contamination of the container.

DESCRIPTION OF THE PREFERRED EMBODIMENT

First Embodiment (FIGS. 1 to 4)

A wafer storage house according to the first embodiment will be described with reference to FIGS. 1 to 4.

A wafer storage house 1 comprises two wafer storage units 10 and 10 which are disposed so as to be confronted with each other in a given interval. There is defined a wafer moving/loading operating space between the wafer storage units 10 and 10 wherein a self-advancing moving/loading unit 20 travels in the wafer moving/loading operating space.

Figure 3:
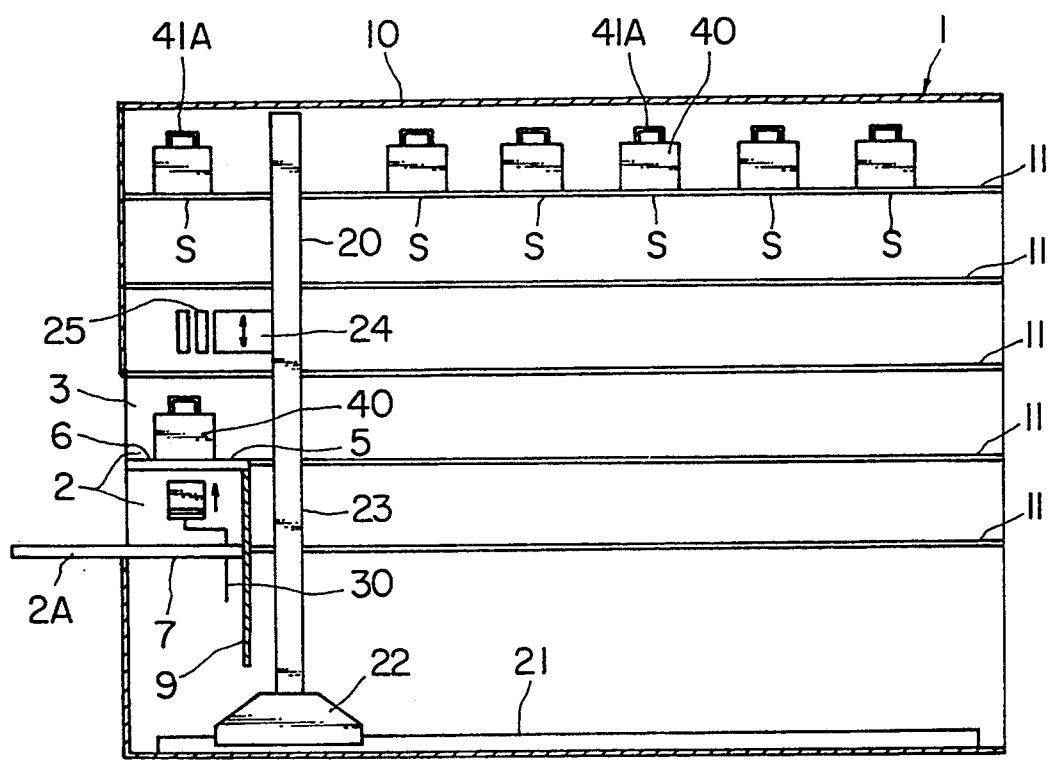
FIG. 3 is a front view of the wafer storage unit of the wafer storage house of FIG. 1.
Figure 7:
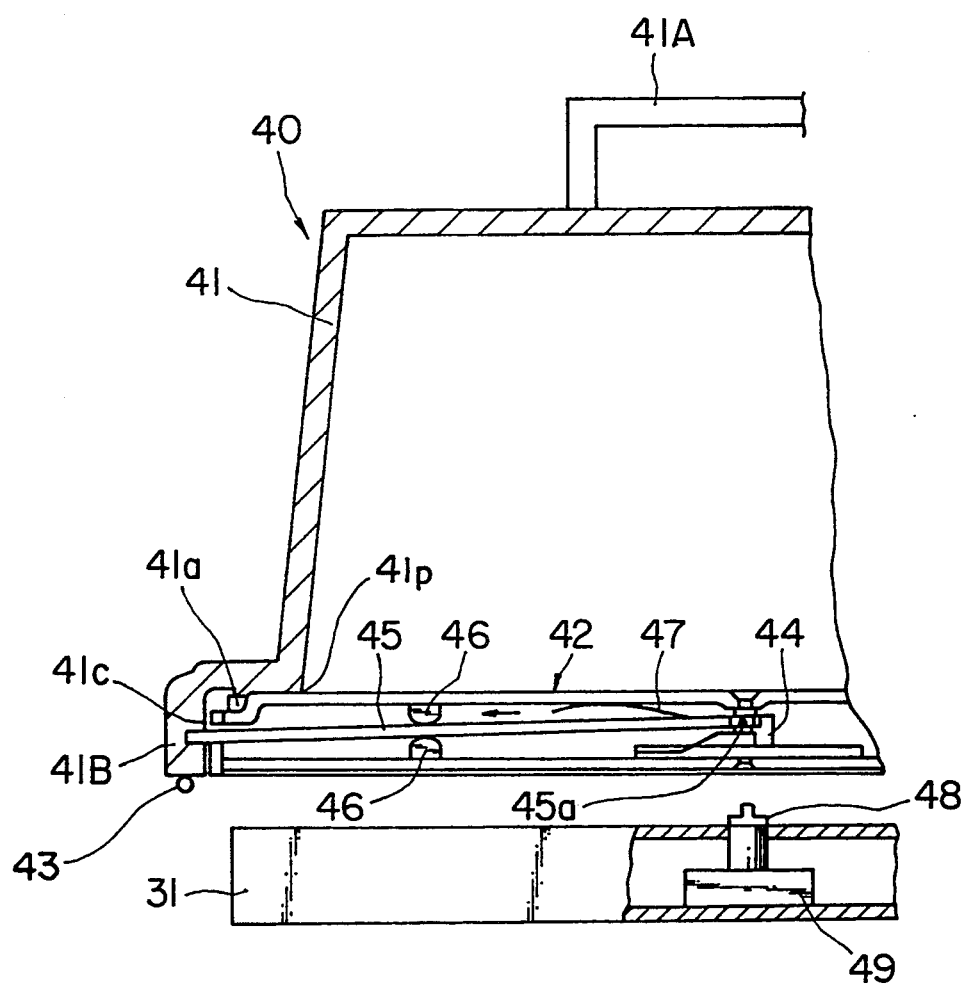
FIG. 7 is a view showing an example of a container to be used in the present invention.

The wafer storage unit 10 is, as illustrated in FIG. 3, a shelf type storage unit having a multi-staged shelves 11 like the conventional storage shelves 115 and 116. The wafer storage unit 10 stores a wafer cassette W while the wafer cassette W is accommodated in an airtight container 40 as illustrated in FIG. 7. Each of the shelves 11 has storage sections S which are disposed at given interval in a longitudinal direction thereof. Each of article carry-in/out portions 2 of the wafer storage house 1 has a container moving/loading portion 3 where the empty container 40 or the container 40 accommodating the wafer cassette W is moved thereto and placed thereon from each shelf and an automatic article delivery unit 30 (as shown in FIG. 3) which carries the wafer cassette W, which is carried in the article carry-in/out portion 2, in the container 40 or carries out the wafer cassette W from the container 40 accommodating therein.

Since the article carry-in/out portion 2 of the wafer storage house is positioned at one end side of the wafer moving/loading space, a handling portion 25 of the self-advancing moving/loading unit 20 comprises a link mechanism. The moving/loading mechanism 20 is a stacker crane comprising a body portion 22 which travels forward and rearward on a pair of rails which are laid between the storage unit 10 and 10, a mast 23 extending from the body portion 22, an elevator portion 24 which is raised or lowered while it is guided by the mast 23 and the handling portion which is supported by the elevation portion 24. The body portion 22 has a control unit therein, not shown.

Figure 4:
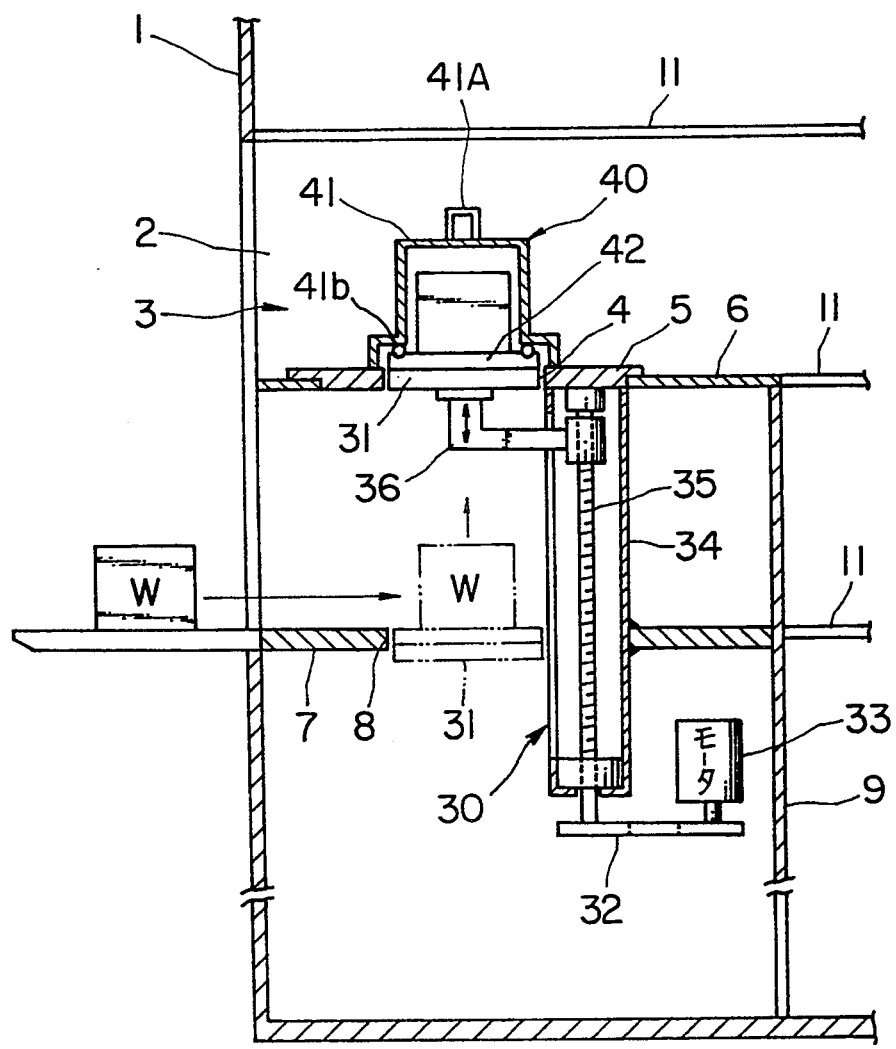
FIG. 4 is a view showing an automatic article delivery unit of the wafer storage unit of the article storage house of FIG. 1.

In FIG. 4, the automatic article delivery unit 30 is an elevator mechanism provided with an elevator table 31 serving as a cover for closing a cassette carry-in port 4 (hereinafter referred to as an elevator table), described later, and comprises a gear unit 32, a motor 33 and a screw shaft 35 housed in a guide cylinder 34. The lower portion of a supporting shaft 36 is screwed to the screw shaft 35. The elevator table 31 is one of the components of the article carry-in/out portion 2 and serves as an article carry-in table. A moving/loading table of the empty container moving/loading portion 3 is an annular plate 5 having the cassette carry-in port 4 and is fixedly supported by a supporter table 6. A table 7 defining the article carry-in/out portion 2 has a hole 8. The elevator table 31 is lowered through the hole 8 until the upper surface thereof is flush with the surface of the table 7 (carry-in position) and is raised through the port 4. Designated at 9 is a partitioned wall.

A container body 41 equipped with a grip 41A is airtightly sealed by a container cover 42 by way of a seal member 41a. The container cover 42 is hollow and has a lock mechanism therein as illustrated in FIG. 7. FIG. 7, denoted at 44 is a cam. A plate shaped lock arm 45 has a roller 45a and is supported like a cantilever so that it can be moved reciprocally and tiltable. Designated at 46 are fulcrum members and 47 is a spring. A camshaft 48 extends from the central portion of an upper wall of the elevator table 31 to the inside of the container cover 42 and is engaged in the cam 44 like a spline when the container cover 42 is placed on the elevator table 31 so as to be coaxial therewith. The elevator table 31 is hollow and has therein a camshaft driving mechanism 49 for turning the camshaft 48 for a given angular interval. The camshaft mechanism 49 and the camshaft 48 constitute a lock closing mechanism.

The cam 44 has a special cam surface and the lock arm 45 is displaced in the direction of the arrow toward an engaging recessed portion 41c and the tip end of the lock arm 45 is engaged in the engaging recessed portion 41c when the cam 44 turns. In the state where the lock arm 45 is engaged in the engaging recessed portion 41c, the space between an opening 41b of the container body 41 and the container cover 42 is airtightly sealed by the seal member 41a. A seal member 43 is fixed to the lower surface of a flange 41B of the container body 41.

In the arrangement of the wafer storage house, suppose that the elevator table 31 of the automatic article delivery unit 30 is positioned in the port 4 of the plate 5 as illustrated in FIG. 3 (delivery position). At this state, if the empty container 40 is moved from one of the shelves 11 to the empty container moving/loading portion 3 by the stacker crane 20 and placed on the plate 5, the camshaft 48 projects into the container cover 42 so that the camshaft 48 engages into the cam 44 like a spline. When the empty container 40 is moved and placed on the plate 5, the camshaft driving mechanism 49 operates so that the cam 44 turns and the lock arm 45 is displaced toward the central portion of the container cover 42 whereby the lock arm 45 is disengaged from the engaging recessed portion 41c, hence the container body 41 is unlocked from the container cover 42. Successively, the elevator table 31 is lowered until it reaches the carry-in position. At this time, the container cover 42 is lowered together with the elevator table 31. When the elevator table 31 is positioned in the carry-in position, the wafer cassette W which is moved and placed on an apron 2A of the article carry-in/out portion 2 is moved and placed on the container cover 42 on the elevator table 31 by a moving/loading robot, etc., not shown. When the wafer cassette W is moved and placed on the container cover 42, the elevator table 31 is raised at the delivery position. When the elevator table 31 is raised at the delivery position and the container cover 42 closes the opening 41b of the container body 41, the camshaft driving mechanism 49 operates so that the camshaft 48 turns in the direction reversed to the direction set forth above. As a result, the lock arm 45 is displaced in the direction of the arrow toward the engaging recessed portion 41c so that the tip end of the lock arm 45 is engaged in the engaging recessed portion 41c. Consequently, the container cover 42 airtightly seals the opening 41b of the container body 41 by way of the seal member 43.

In such a manner, the wafer cassette W is airtightly accommodated in the container 40 of the wafer storage house I and the container 40 accommodating the wafer cassette W is transferred to the specified storage section S of the specified shelf by the stacker crane 20 and stored temporarily therein.

When the wafer cassette W is taken out from the container 40 accommodating the wafer cassette W, the following operations should be taken. The container 40 accommodating the wafer cassette W is moved from the storage section S of the shelf 11 to the container moving/loading portion 3 by the stacker crane 20 at the state where the elevator table 31 of the automatic article delivery unit 30 is positioned inside the port 4 of the plate 5 as shown in FIG. 4 and it is placed on the plate 5 whereby the camshaft 48 projects inside the container cover 42 and engaging in the cam 44 as a spline. Successively, the camshaft driving mechanism 49 operates to thereby disengage the lock arm 45 from the engaging recessed portion 41c whereby the container body 41 is unlocked from the container cover 42. When the container body 41 is unlocked from the container cover 42, the elevator table 31 is lowered from the carry-in position to the delivery position while loaded with the container cover 42 (on which the wafer cassette W is placed) so that the wafer cassette W can be taken out from the outside of the wafer storage house.

As mentioned above, since the wafer cassette W is accommodated and stored in the airtight container 40 according to the present invention, it is not necessary to keep the entire wafer storage house 1 in the highly clean atmosphere. Accordingly, neither the large-scale clean air supply system equipped with the high-performance filter nor the circulation system is necessary. Furthermore, neither the structure and shape of the inside of the wafer storage house nor the parts and components of the wafer storage house should be specially considered. Still furthermore, if walls are provided in the wafer storage house, mere partitions can be provided instead of the walls. Since the wafer storage house can be cleaned by utilizing downward air current in the clean room. As a result, the wafer storage house 1 can be miniaturized with low cost compared with the conventional storage house. The problem of the inferior maintenance can be also solved.

Since the wafer storage house 1 is dispensed with the high-performance clean air supply system and the circulation system, the wafer storage house 1 is not affected by the power failure. Even if the stacker crane 20 or other components are troubled, the contamination caused by such trouble and the maintenance thereof does not influence upon the airtight container 40 so that the wafer cassette W can be freely carried in and out and an operator can enter the wafer storage house 1 freely to maintain the components in the wafer storage house 1.

Figure 5:
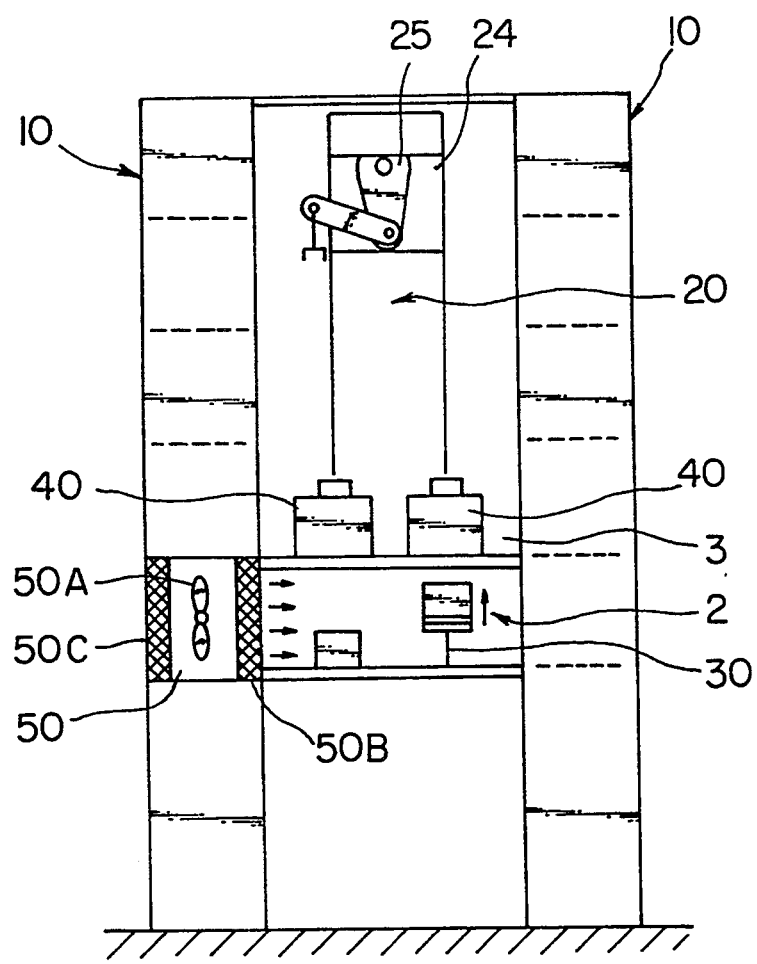
FIG. 5 is a front view of a wafer storage house in a clean room according to a second embodiment of the present invention.

Second Embodiment (FIG.5)

In the article carry-in/out portion 2, since the container cover 42 of the container 40 is open and closed to thereby subject the inside of the container body 41 to expose to the atmosphere, a filter unit 50 composed of a fan 50A, a high-performance filter 50B such as a HEPA (High Efficiency Particulate Air) filter or an ULPA (Ultra Efficiency Particulate Air) filter may be provided, as illustrated in FIG. 5, for jetting clean air toward the article carry-in/out portion 2 in order to prevent the inside of the container body 41 from being contaminated. Denoted at 50C is an ordinary filter.

In the first and second embodiments, the container 40 is not carried in from or carried out to the outside of the wafer storage house 1. Accordingly, in case that the container 40 which is carried in the wafer storage house 1 from the outside is differentiated from the container in the wafer storage house 1, the wafer cassette W may be transferred from the container 40, which is carried in from the outside of the wafer storage house 1, to the container in the wafer storage house 1 if the container 40 is carried in the wafer storage house 1 while it is accommodated therein.

Figure 6:
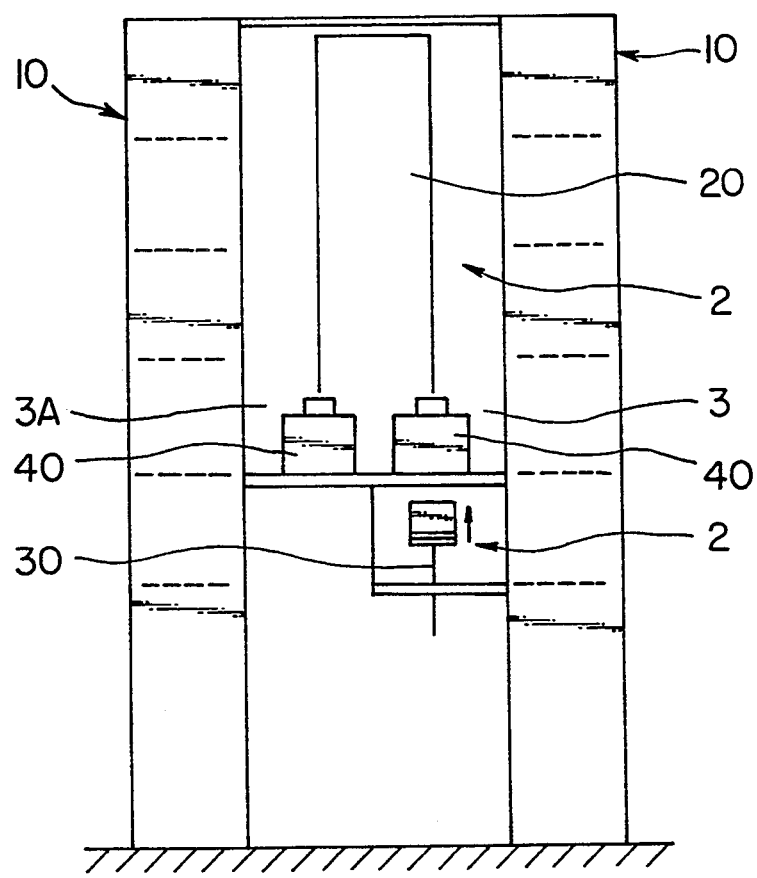
FIG. 6 is a front view of a wafer storage house in a clean room according to a third embodiment of the present invention.

Third Embodiment (FIG. 6)

If there is no problem of cleanliness in the container 40, a container carry-in/out portion 3A may be provided for carrying the container 40 in the wafer storage house 1 from or carrying out the container 40 to the outside thereof as illustrated in FIG. 6.

Fourth Embodiment (FIGS. 8 to 13)

An article storage house according to a fourth embodiment will be described with reference to FIGS. 8 to 13 in which a wafer storage house has an inert gas purging function.

Figure 8:
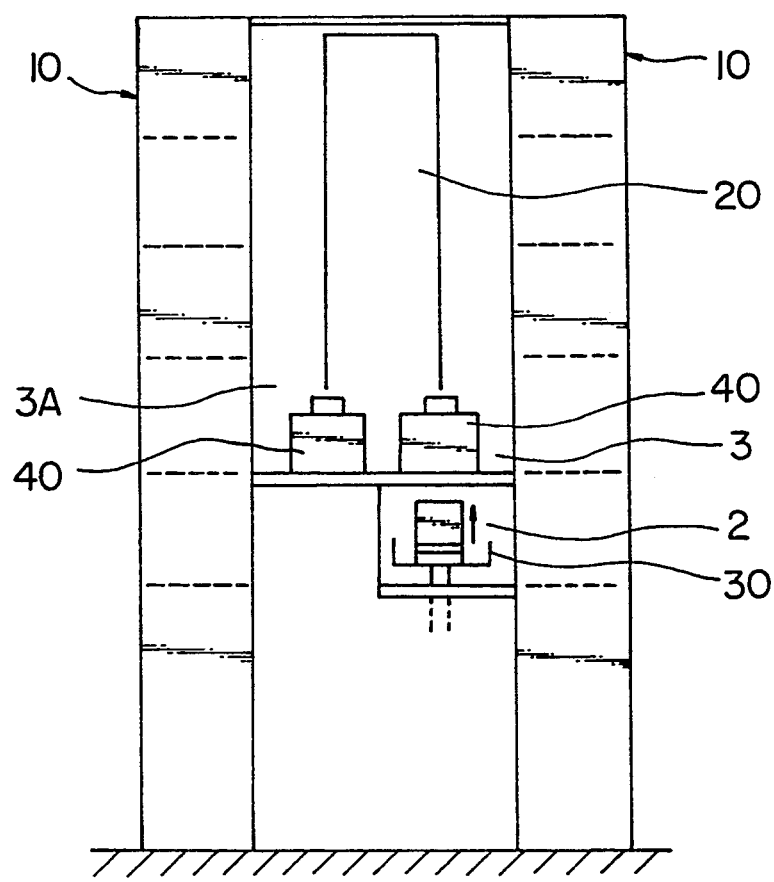
FIG. 8 is a front view of a wafer storage house in a clean room according to a fourth embodiment of the present invention.
Figure 9:
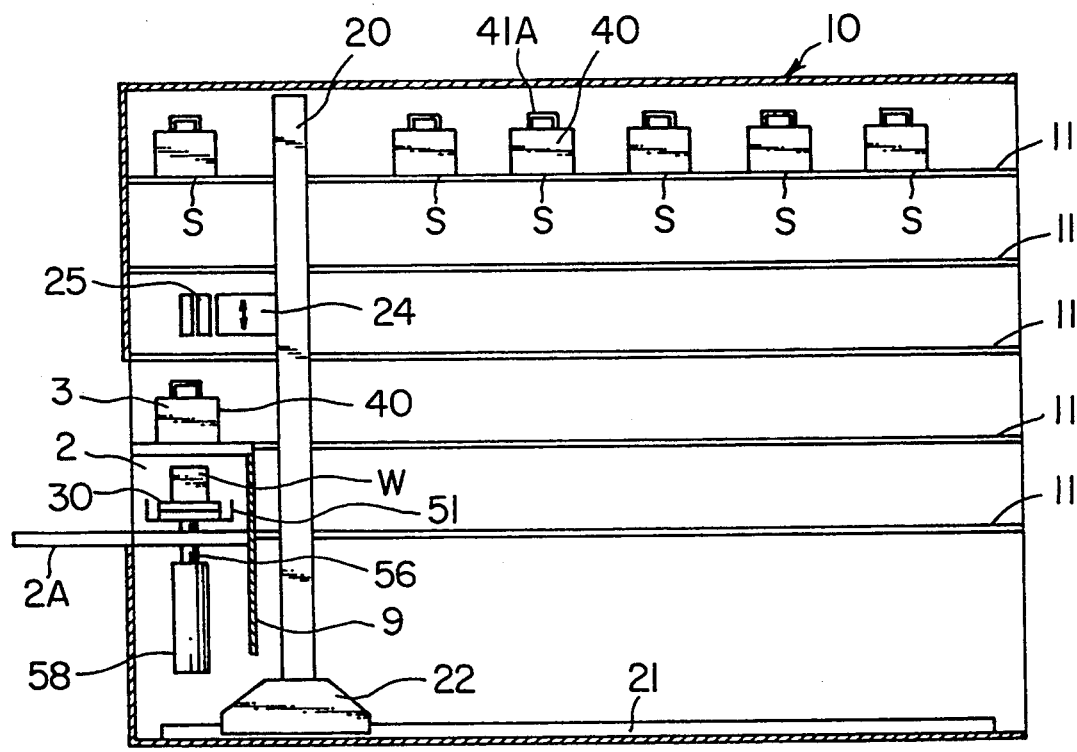
FIG. 9 is a front view of the wafer storage unit of the article storage house of FIG.8.

The wafer storage house of the fourth embodiment is different from that of the first embodiment in respect that the automatic article delivery unit 30 has an $N_2$ gas purge mechanism as shown in FIGS. 8 and 9.

Figure 10:
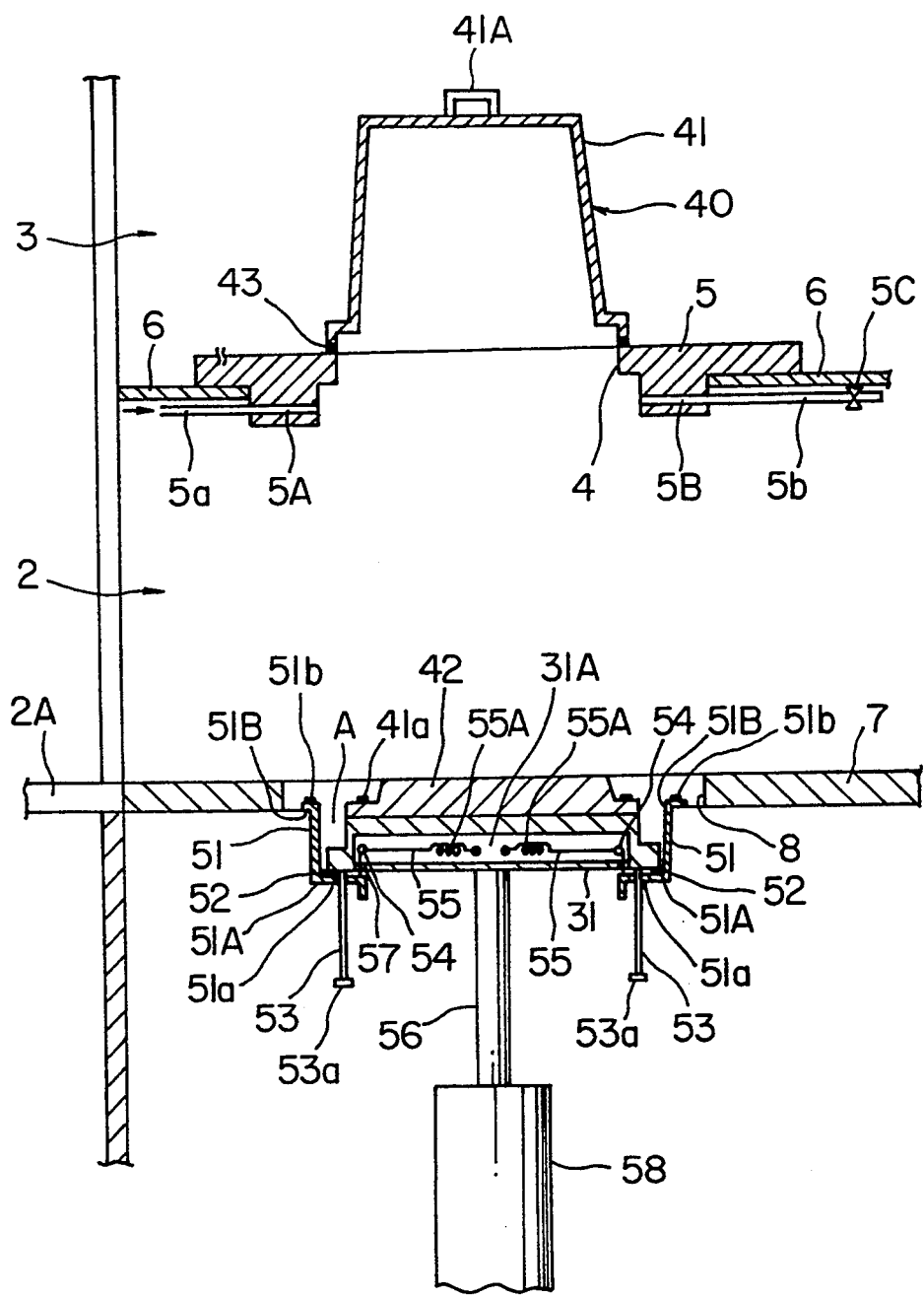
FIG. 10 is a view showing an automatic article delivery unit of the wafer storage unit of the article storage house of FIG.8.

In FIG. 10, a cylindrical skirt 51 defines an inner space A through which the elevator table 31 can be raised or lowered. A lower engaging peripheral portion (lower flange) is formed at the lower end of the skirt 51A and a plurality of guide holes 51a are formed on the lower flange 51A. A seal member (e.g. O ring) 52 is attached to the upper surface of the lower flange 51A so as to surround the plurality of guide holes 51a and it is confronted with the outer peripheral portion of the lower surface of the elevator table 31. An upper engaging peripheral portion (upper flange) 51B is formed at the upper end portion of the skirt 51 and it is directed outward and a seal member (e.g. O-ring) 51b is attached to the surface of the upper flange 51B. Guide levers 53 extend vertically downward from the lower surface of the elevator table 31 and have stoppers 53a at the lower end thereof for the cylindrical skirt 51 and penetrate the guide holes 51a. Denoted at 54 are guide rollers defined at the inner space 31A of the elevator table 31 and 55 is a biasing unit (sling) composed of hanging wires having coiled springs 55A part of which is preliminarily loaded. Both ends of the coiled springs 55A are held by a stop pin 56 which is disposed inside the inner space 31A and another ends of the coiled springs 55A are held by the guide rollers 54 and drawn outside from the holes 57 defined immediately under the guide rollers 54 of the elevator table 31 and hang down and are held by the inner peripheral end of the lower flange 51A of the skirt 51. FIG. 10 shows the state where the elevator table 31 of the automatic article delivery unit 30 is lowered at the carry-in position wherein the elevator table 31 depresses the skirt 51 against the resiliency of the biasing unit 55 so that the lower surface of the elevator table 31 is pressed against to contact the lower flange 51A of the skirt 51 by way of the seal member 51a. Denoted at 36 is a shaft of the elevator table 31 and 58 is a cylinder unit for raising and lowering the elevator table 31.

Denoted at 5A is a gas supply port which penetrates radially the lower portion of the plate 5 and is connected to an $N_2$ gas cylinder, not shown, through a pipe 5a. Denoted at 5B is a gas discharge port which penetrates radially the lower portion of the plate 5 and 5C is a solenoid valve provided on the pipe 5b.

Figure 11:
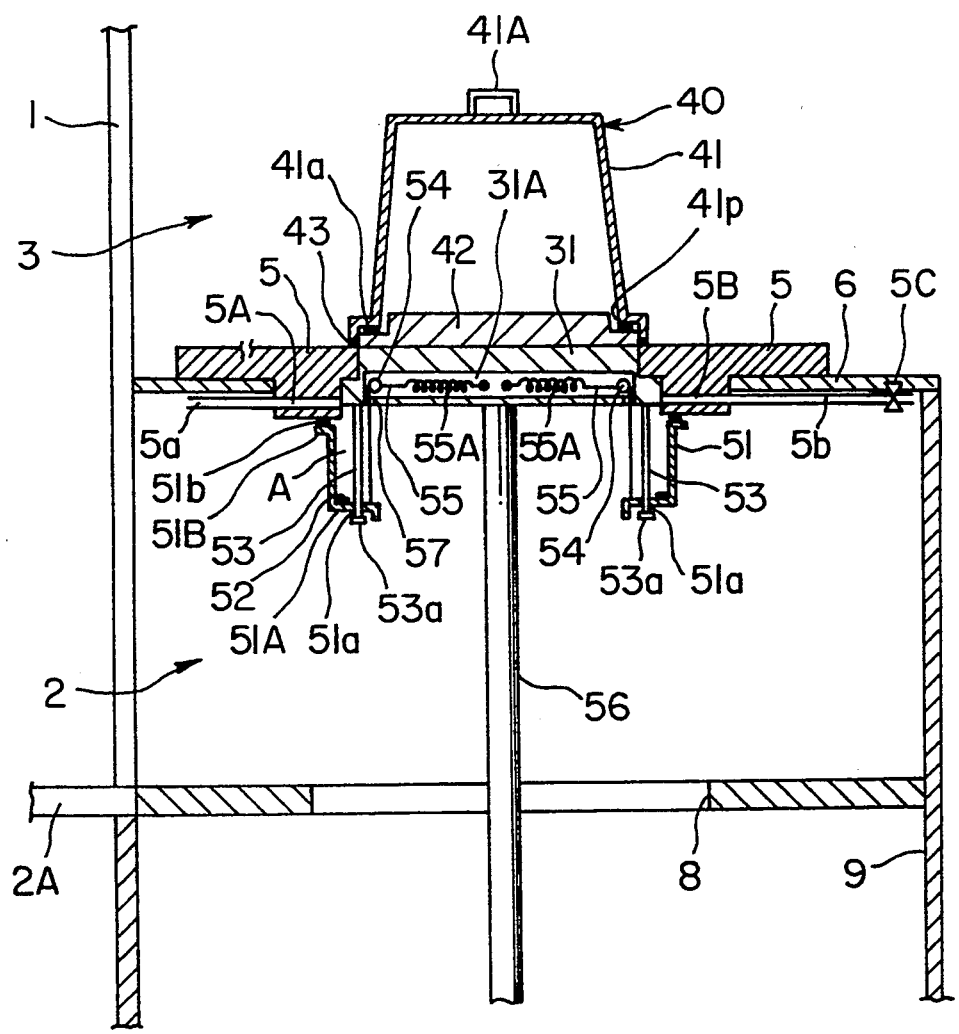
FIG. 11 is a view showing the operation of the automatic article delivery unit of the wafer storage unit of the wafer storage house of FIG. 8.

An operation of the wafer storage house according to the fourth embodiment will be described with reference to FIGS. 10 to 12.

Suppose that the the elevator table 31 of the automatic article delivery unit 30 is positioned inside the port 4 of the plate 5 (delivery position) as illustrated in FIG. 10. In this state, the upper end portion of the skirt 51 is engaged with the lower surface of the plate 5 by way of the seal member 51b. If the empty container 40 is moved by the stacker crane 20 from one of the shelves 11 to the empty container moving/loading portion 3 and placed on the plate 5, the camshaft 48 projects inside the container cover 42 and engaging in the cam 44 like a spline in the same manner as the wafer storage house 1 of the first embodiment. After the empty container 40 is placed on the plate 5, the camshaft driving mechanism 49 operates to thereby turn the cam 44 so that the lock arm 45 is displaced toward the central portion of the container cover 42 whereby the lock arm 45 is disengaged from the engaging recessed portion 41c and the container body 41 is unlocked from the container cover 42.

After the container body 41 is unlocked from the container cover 42, the elevator table 31 is lowered at the carry-in position. At this time, the container cover 42 is lowered together with the elevator table 31. As shown in FIG. 10, when the elevator table 31 is positioned in the carry-in position, the wafer cassette W which is placed on the apron 2A of the article carry-in/out portion 2 is moved to and placed on the container cover 42, which is placed on the elevator table 31, by a moving/loading robot, etc. not shown. When the wafer cassette W is moved to and placed on the container cover 42, the elevator table 31 and the skirt 51 are raised. When the elevator table 31 is raised to some height (gas purge position), the seal member 51b is pressed against to contact the lower surface of the plate 5 as illustrated in FIG. 12. At this time, since the peripheral portion of the lower surface of the elevator table 31 compresses the seal member 51a between itself and the lower flange 51A, the inside of the skirt 51 communicates with the inside of the container 40 but it is airtightly sealed from the outside of the skirt 51 so that the inside of the container 40 is also airtightly sealed from the outside of the container 40.

Figure 12:
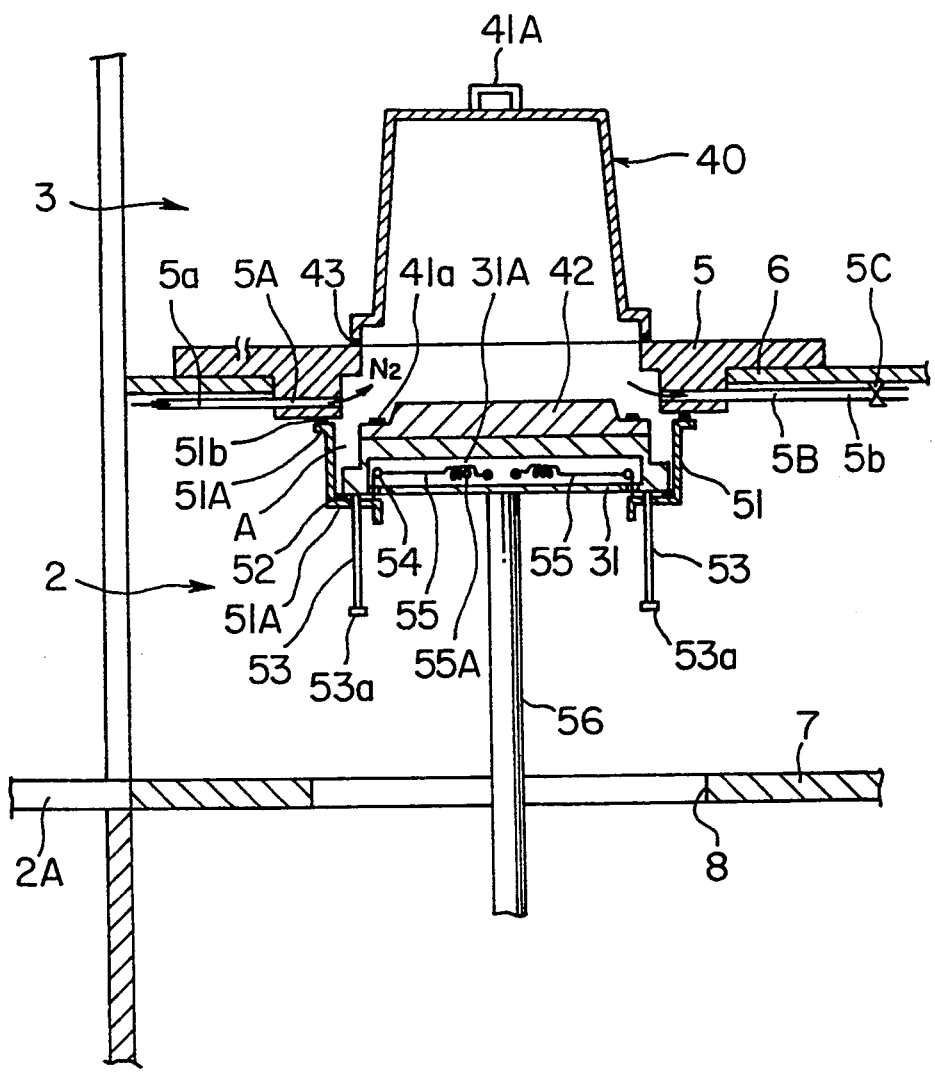
FIG. 12 is a view showing also the operation of the automatic article delivery unit of the wafer storage unit of the wafer storage house of FIG. 8.

When both the elevator table 31 and the skirt 51 are raised to the height as illustrated in FIG. 12, the solenoid valve 5C is open so that the $N_2$ gas in introduced into the container 40 through the gas supply port 5A at the rate of 70 liters/min for about 5 minutes and thereafter the air in the container 40 is discharged through the gas discharge port 5B whereby the air in the container 40 is replaced by the $N_2$ gas.

Upon completion of the replacement of the $N_2$ gas, the elevator table 31 is raised to the delivery position as illustrated in FIG. 10. When the container cover 42 closes the opening 41a of the container body 41 after the elevator table 31 is raised to the delivery position, the camshaft driving mechanism 49 in the elevator table 31 operates to thereby turn the camshaft 48 in the direction opposite to the direction set forth above so that the lock arm 45 is displaced in the direction of the arrow toward the engaging recessed portion 41c and the tip end of the lock arm 45 is engaged in the engaging recessed portion 41c. Accordingly, the container over 42 airtightly seals the opening 41b of the container body 41 by way of the seal member 43.

In such a manner, the wafer cassette W is airtightly accommodated in the container 40 in the wafer storage house and the container 40 accommodating the wafer cassette W is moved to the specified storage section of the specified shelf by the stacker crane 20 and is temporarily stored in the storage section.

When the wafter cassette W is taken out from the container 40 accommodating the wafer cassette W, the $N_2$ gas purge is not performed. It is a matter of course that the automatic article delivery unit which is not equipped with the $N_2$ gas purge mechanism can be provided separately.

As mentioned above, since the wafer cassette W is accommodated and stored in the airtight container 40 in which air is replaced by the $N_2$ gas, there are following advantages.

Since the $N_2$ gas purge is performed in case of accommodating the wafer cassette W in the container 40 at the article carry-in/out portion 2 according to the fourth embodiment, the $N_2$ gas purge mechanism may be provided at the article carry-in/out portion 2 alone. If there is no sufficient time to be involved in performing the $N_2$ gas purge at the article carry-in/out portion 2, the $N_2$ gas purge function inside the storage section, etc. may be used.

Since the wafer cassette W is accommodated and stored in the airtight container 40 in which air is replaced by the $N_2$ gas according to the fourth embodiment, natural oxide film is restrained from growing on the surface of the semiconductor wafer during the storage thereof.

Since the entire inside of the wafer storage house is not in the inert gas atmosphere, different from the article storage house as disclosed in Japanese Patent Application No. 3-9401, there does not occur the suffocation problem. Furthermore, since the wafer cassette W is accommodated and stored in the airtight container 40, the container 40 is not necessarily to be open or closed during the storage of the wafer cassette W, different from the article storage house as disclosed in Japanese Patent Application No. 3-9404, and has no problem existing in the article storage house having sectioned rooms as disclosed in Japanese Patent Application No. 3-9404 wherein the door is open or closed every time the wafer cassette is carried in or out. Still furthermore, the wafer storage house according to the fourth embodiment does not consume much gas hence the cost involved in the consumption of the gas is low.

Figure 13:
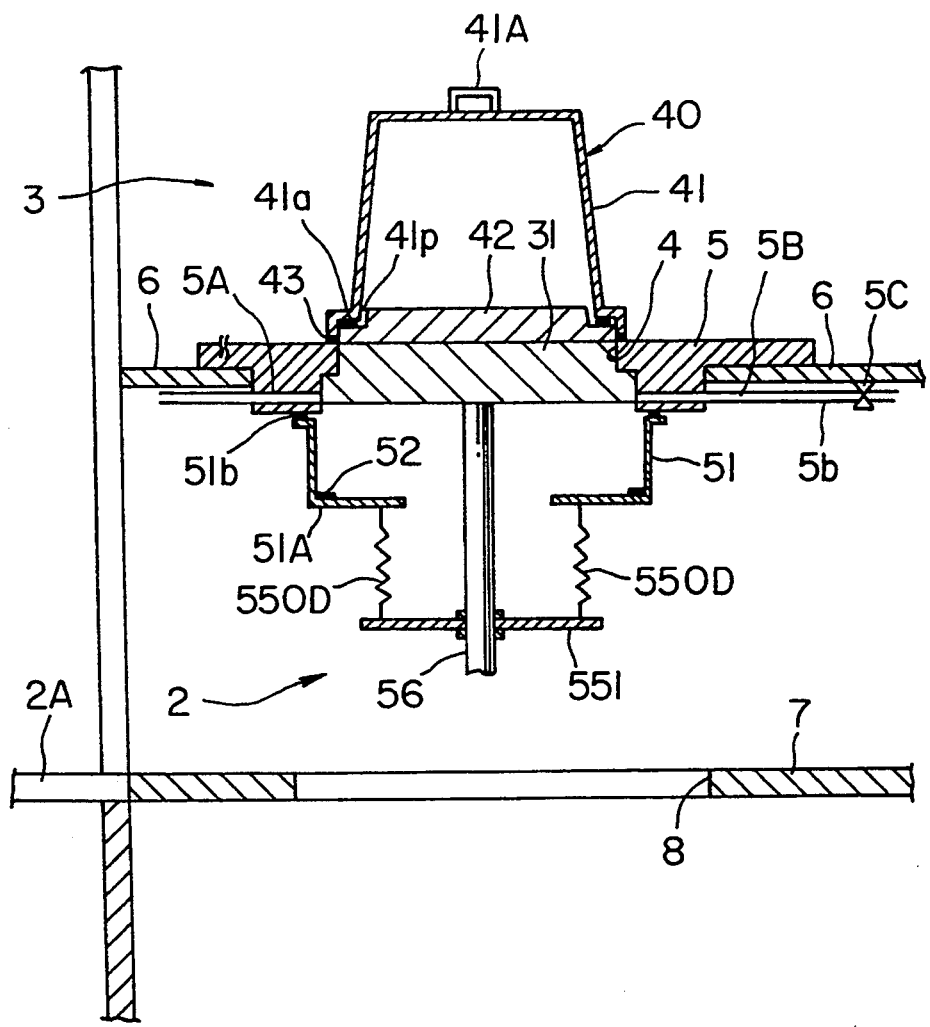
FIG. 13 is a view showing another example of an automatic article delivery unit of the wafer storage unit of the wafer storage house of FIG.8.

FIG. 13 shows an article storage house equipped with another example of the automatic article delivery unit 30 having an $N_2$, gas purge mechanism. The article storage house of this example is different, from that as illustrated in FIGS. 11 and 12 in respect that the former uses a coiled spring 5500 in stead of the sling 55 of the latter. A table 551 serving as a spring seat is fixed to the shaft 56 of the elevator table 31 and a plurality of coiled springs 550D are disposed between the table 551 and the lower flange 51A of the skirt 51 so as to be preliminarily loaded.

Figure 14:
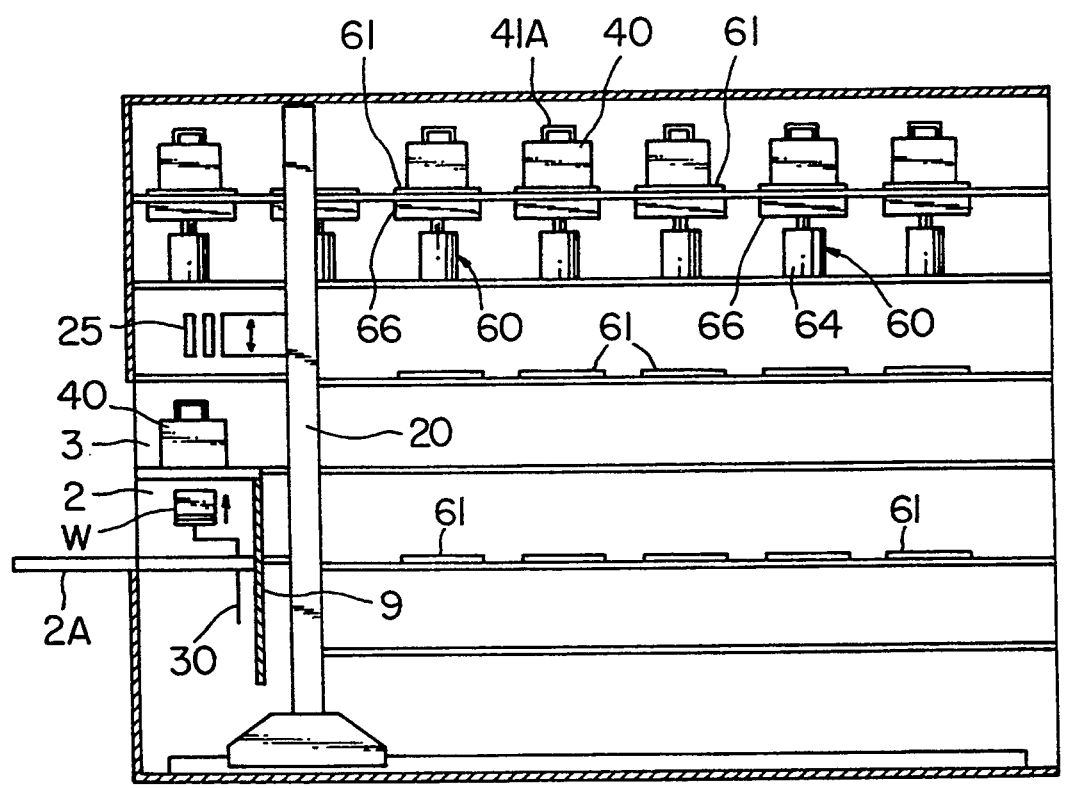
FIG. 14 is a front view of a wafer storage unit of the wafer storage house according to a fifth embodiment of the present invention.
Figure 15:
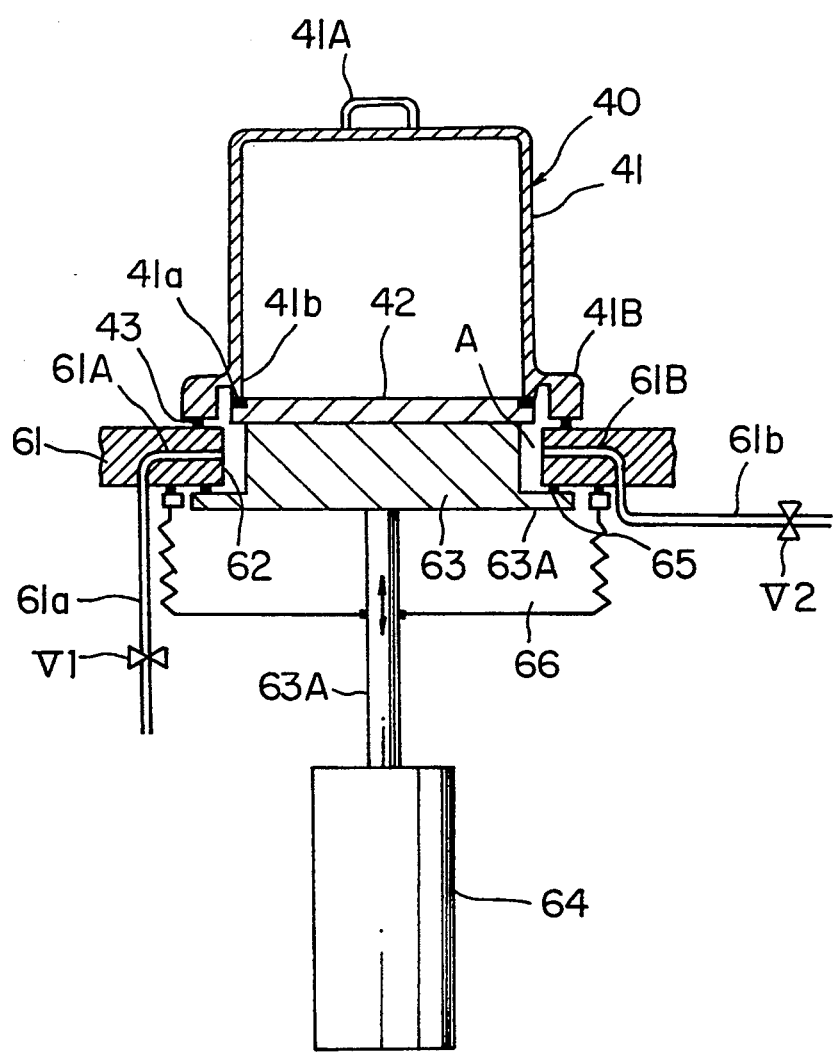
FIG. 15 is a view showing an automatic article delivery unit of the wafer storage unit of FIG. 14.

Fifth Embodiment (FIGS. 14 and 15)

An article storage house according to a fifth embodiment is illustrated in FIGS. 14 and 15 which show another example of the article storage house. The wafer storage house of the fifth embodiment is different from that of the first embodiment in respect that the former has an $N_2$ gas purge units 60 which are additionally provided respectively in the container storage sections of the shelves 11 in the latter.

In FIG. 15, a storage table on the container storage section comprises an annular plate 61 having a port 62. The gas purge unit 60 has an elevator table 63 which can be moved in the port 62 from the lower position and a lifting mechanism (cylinder unit) 64 to raise or lower the elevator table 63. The elevator table 63 has a flange 63A which is pressed against to contact the lower surface of the plate 61 by way of a seal member 65 and also has a lock closing mechanism in the same way as the elevator table 31 as illustrated in FIG. 4. A bellows 66 is provided to cover the port 62 of the plate 61 from the lower portion thereof and has an upper end which is closely fixed to the lower surface of the plate 61. A shaft 63A of the elevator table 63 penetrates the bellows 66 airtightly.

A gas supply port 61A penetrates the lower portion of the plate 61 radially and is connected to an $N_2$ gas cylinder, not shown, through a gas supply pipe 61a. Denoted at 61B is an $N_2$ gas discharge port which penetrates the lower portion of the plate 61 radially and the $N_2$ gas is discharged from a gas discharge pipe 61b through the $N_2$ gas discharge port 61B. V1 is a valve provided on the gas supply pipe 61a and V2 is a valve provided on the gas discharge pipe 61b.

With the arrangement of the wafer storage house, the wafer cassette W is accommodated in the container 40 at the article carry-in/out portion 2 and the container 40 so accommodating the wafer cassette W is moved to the storage table 61 of the container storage section on the specified shelf 11 by the stacker crane 20 and is placed on the storage table 61. When the container 40 is moved to and placed on the storage table 61, the camshaft 48 protruding from the elevator table 63 is engaged in the cam 44 of the container cover 42 like a spline.

Accordingly, when the lock closing mechanism in the elevator table 63 operates, the container body 41 is unlocked from the container cover 42 so that the container cover 42 is removed and the inside of the container body 41 communicates with the port 62 if the elevator table 63 is slightly lowered. Since the flange 63A of the elevator table 63 is also moved away from the lower surface of the plate 61, the inside of the container body 41 communicates with the space surrounded by the bellows 66 through the port 62 but the space surrounded by the bellows 66 is airtightly sealed from the outside of the bellows 66.

When the valve V1 connected to the gas cylinder and provided on the gas supply pipe 61a and the valve V2 provided on the gas discharge pipe 61b are respectively open and the $N_2$ gas is compressedly introduced into the space A, which is defined by the elevator table 63, the plate 61 and the container body 41, from the gas supply port 61A, air inside the container body 41 is replaced by the $N_2$ gas.

Meanwhile, the material of the container 40 should be metal and the container should be hard and the seal member should be rigid such as an O ring and furthermore the container body 41 and the container cover 42 should be fixed tightly in order to keep the container to be airtight perfectly. However, in a practical manner, the container is formed of resin so that the inside thereof can be seen and is lightweight and the seal member has the material and shape to correspond to the strength of the container and to make the lock closing mechanism operate. Accordingly, the container is hard to be airtight perfectly, which involves in the inevitable leakage of the gas. As a result, the concentration of the inert gas in the container 40 is lowered if the storage time is long so that there is a possibility that the natural oxide film grows on the surface of the semiconductor wafer during the storage thereof. According to the fifth embodiment, since the container storage section has the $N_2$ gas purge unit 60, the concentration of the $N_2$ gas in the container 40 can be maintained at a desired level by performing again the $N_2$ purge (hereinafter referred to as performing $N_2$ gas re-purge) gas at an arbitrary time. However, if the $N_2$ gas purge unit 60 is provided in each container storage section, the wafer storage house 1 becomes large-scale and costs high.

Figure 16:
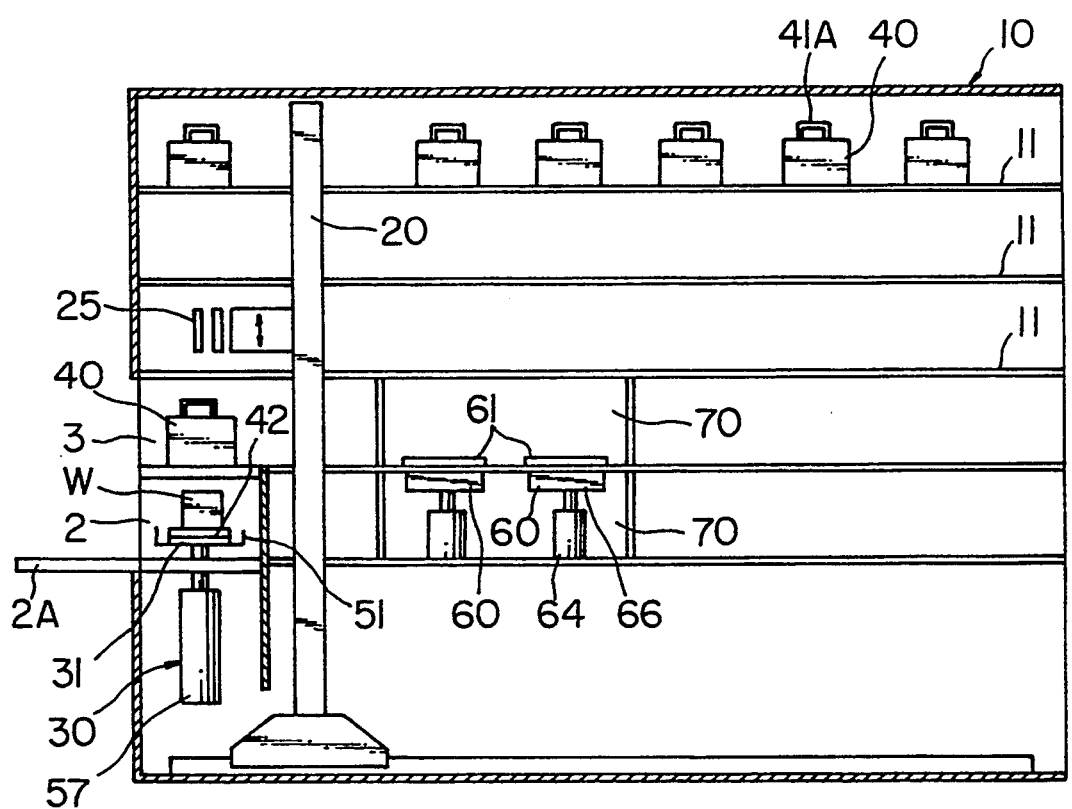
FIG. 16 is a front view of a wafer storage unit of a wafer storage house according to a sixth embodiment of the present invention.

Sixth Embodiment (FIG. 16)

A wafer storage house according to a sixth embodiment is illustrated in FIG. 16. The wafer storage house 1 solves the problem of that of the fifth embodiment in which a part of shelves 11 of the wafer storage units 10 is utilized as an $N_2$ gas re-purge station 70 for performing the $N_2$ gas re-purge. A gas purge unit which is the same as the gas purge unit 60 as shown in FIG. 15 is disposed in the $N_2$ gas re-purge station 70.

With the arrangement of the wafer storage house, the container 40, in which the $N_2$ gas re-purge should be performed, is moved by the moving/loading unit 20 and placed on the $N_2$ gas re-purge station 70 where the $N_2$ gas re-purge is performed and is then returned to an original container storage section.

Although the $N_2$ gas re-purge may be performed periodically under time control with ease but it may be performed based on the concentration of after the $N_2$ gas in the container 40 upon measurement of the concentration.

Figure 1:
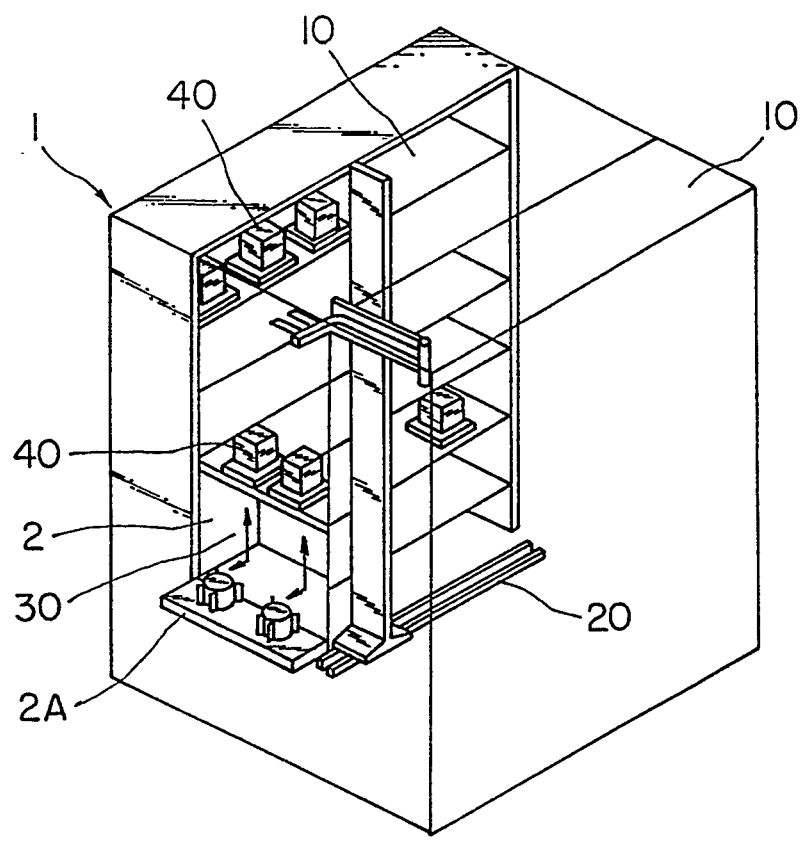
FIG. 1 is a perspective view of a wafer storage house in a clean room according to a first embodiment of the present invention.
Figure 2:
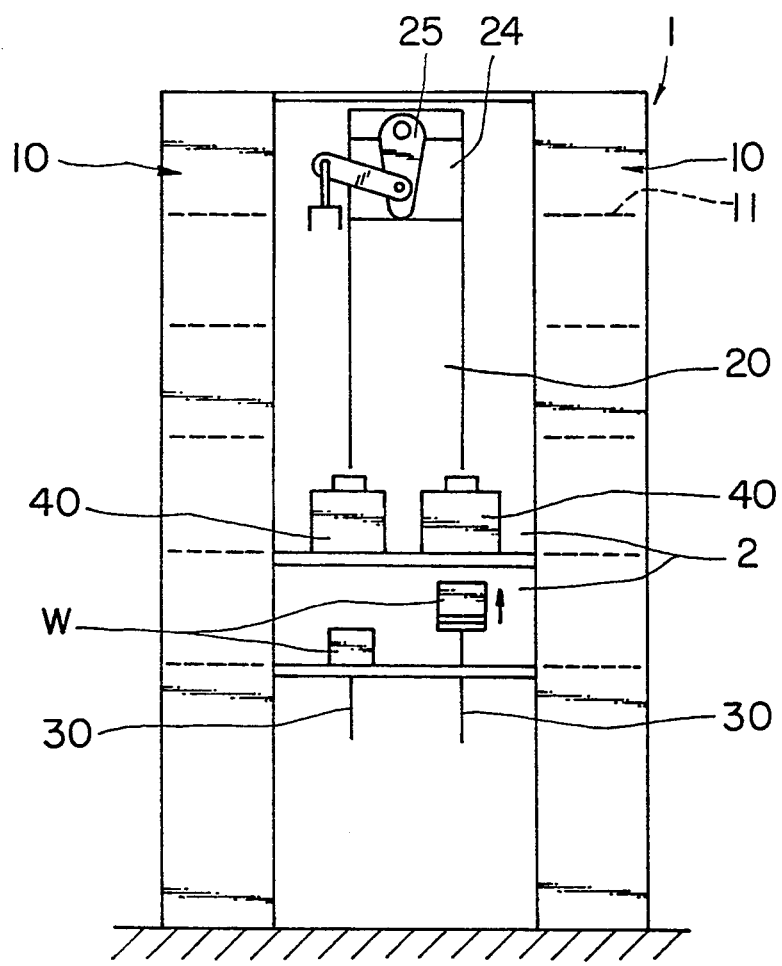
FIG. 2 is a front view of the wafer storage house of FIG. 1.

The N₂ gas re-purge can be performed in the article carry-in/out portion 2 or some storage sections S according to the first embodiment as illustrated in FIG. 1.

Figure 17:
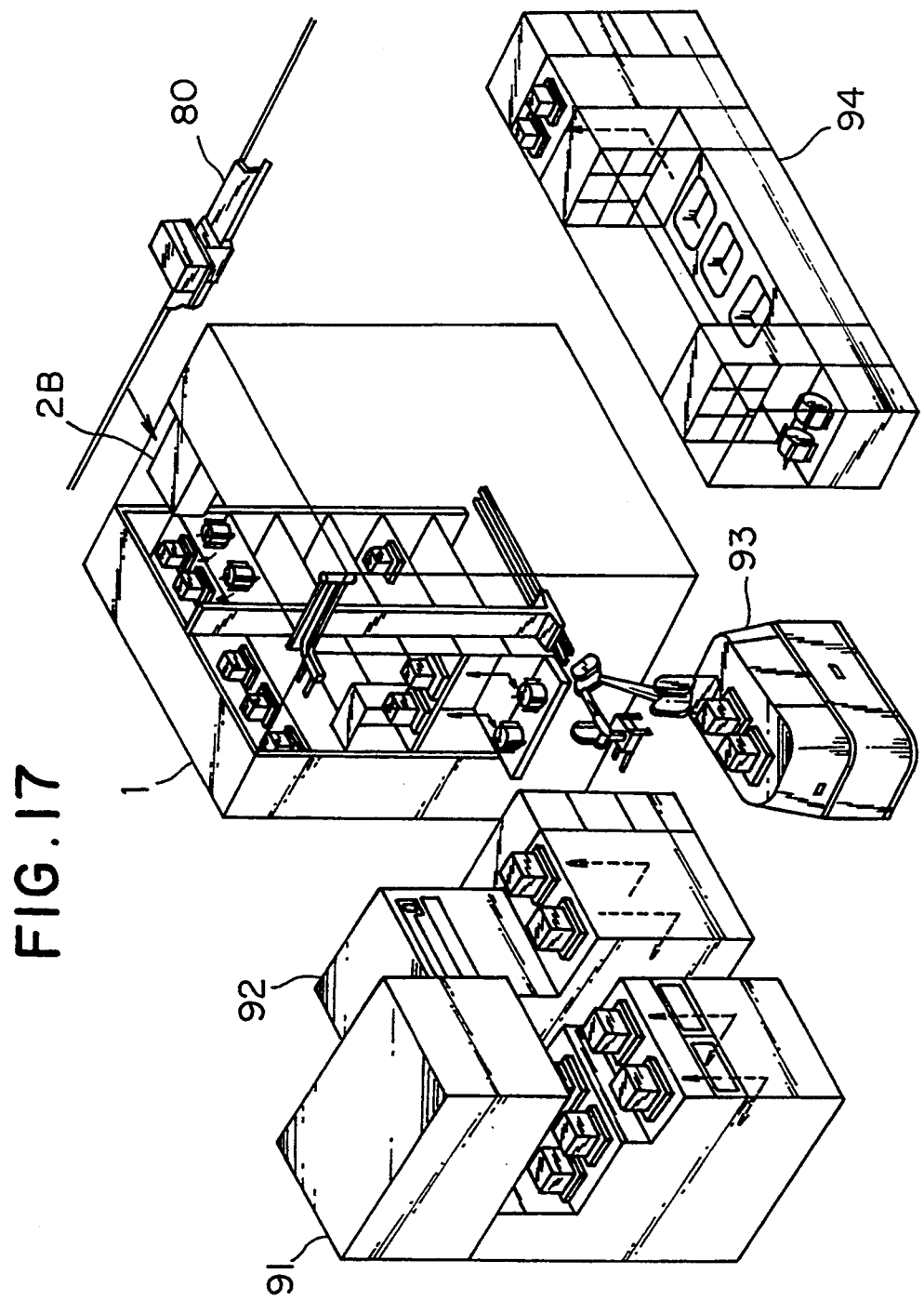
FIG. 17 is a view showing an example of a semiconductor manufacturing system incorporating therein the wafer storage house of the fourth embodiment.
Figure 18:
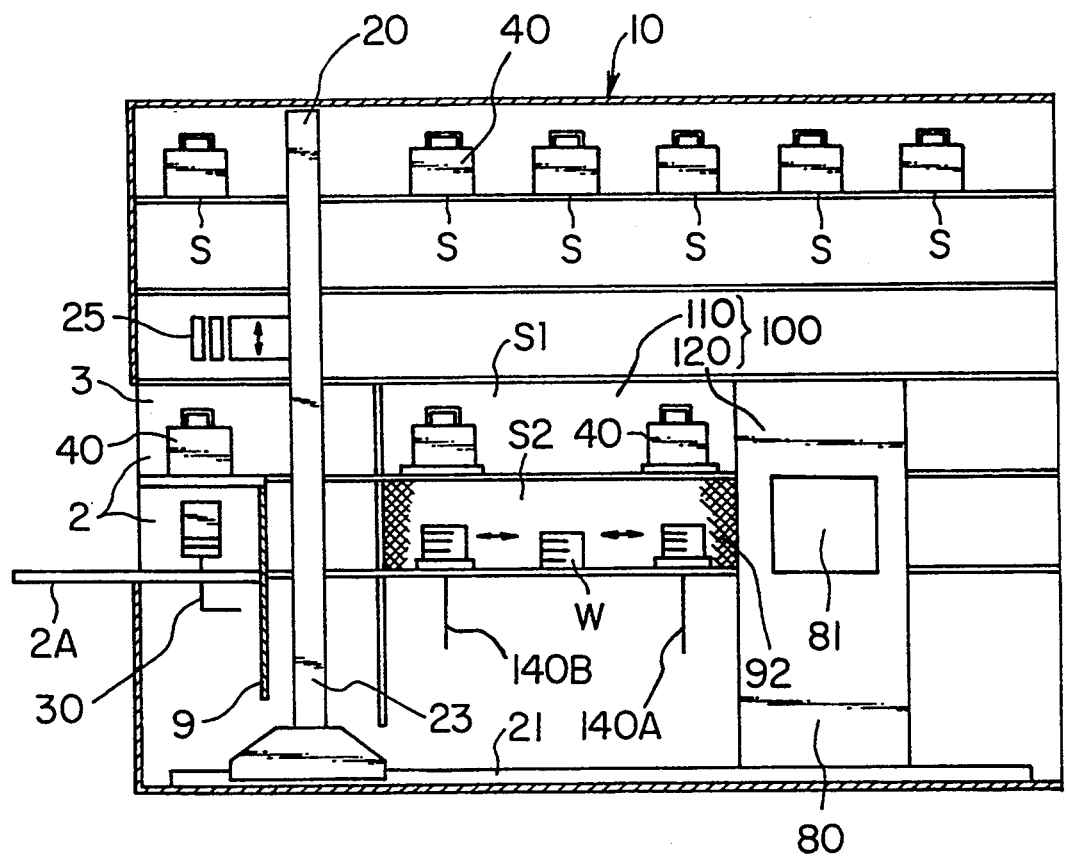
FIG. 18 is a front view of a wafer storage unit of a wafer storage house according to a seventh embodiment of the present invention.
Figure 19:
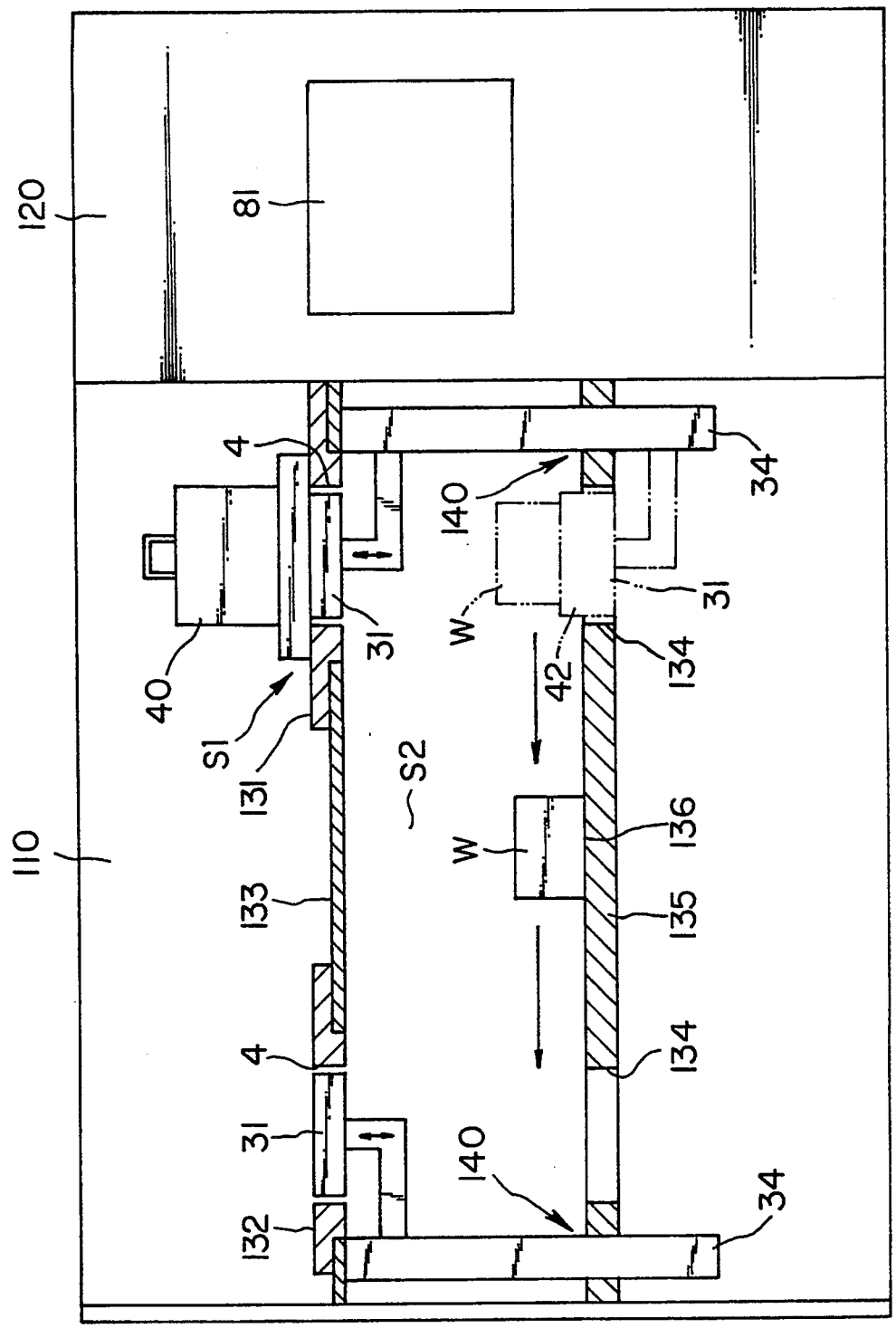
FIG. 19 is an enlarged view showing a main portion of the wafer storage house of FIG. 18.
Figure 20:
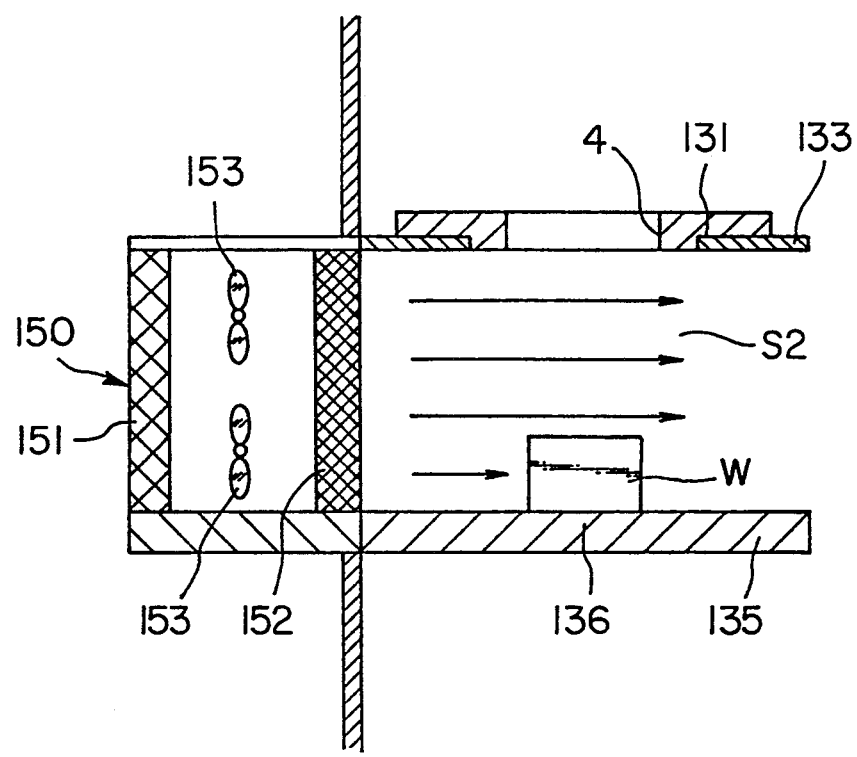
FIG. 20 is a view showing an area where a cassette is temporarily placed according to the wafer storage house of FIG. 18.

FIG. 17 shows an example of a semiconductor manufacturing system in which the wafer storage house 1 as illustrated in FIG. 8 is disposed. The system comprises a surface treating furnace 91 wherein the surface of the semiconductor is treated, a wafer inspecting apparatus 92, a moving/loading robot 93 and a cleaning apparatus 94 in addition to the wafer storage house 1. There are provided an article carry-in/out portion 2B disposed in the wafer storage house 1 and a linear motor type carrying apparatus for moving the article from the article carry-in/out portion 2B to the apparatus in the succeeding step.

It is possible to obtain the same advantage even if the the crystal display substrate, reticles, disks are stored temporarily although the semiconductor wafer is exemplified as the article to be stored temporarily according to the first to sixth embodiments. The container cover 42 has a lock mechanism but the container body 41 or the plate 5 has the lock mechanism.

Inasmuch as the wafer cassette W is not stored as the naked one but is stored in the storage house while it is accommodated in the airtight container, which involves in dispensing with the structure or instruments, implements and apparatus for keeping the inside of the wafer storage house to be in a highly clean atmosphere or the inert gas atmosphere. Accordingly, the wafer storage house can be manufactured with low cost compared with the conventional wafer storage house. Furthermore, there is no likelihood of contamination of the wafer and generation of natural oxide film on the wafer caused by the trouble of the instruments, implements and apparatus and by the power failure of these instruments, implements and apparatus and the maintenance can be performed freely in the wafer storage house, which results in greatly improving the reliability of the quality of the wafer.

Although there does not occur particle contamination in the wafer storage house of this type wherein the inside of the container and the inner surface of the container cover are clean, there occurs the contamination of the container caused by a particle of dust floating in the atmosphere in the wafer storage house or the contamination of container caused by chemicals, etc. from the wafer, etc. while the wafers, etc. are repeatedly stored, which generates such a problem that the merit of storing the wafers in the airtight containers is reduced.

To solve this problem, the inventor developed a wafer storage house as illustrated in FIGS. 18 to 21.

Seventh Embodiment (FIGS. 18 to 21)

A wafer storage house according to a seventh embodiment will be described with reference to FIGS. 18 to 21.

An automatic container cleaning portion 100 is disposed in a part of one of the wafer storage unit 10 and comprises a container cleaning preparatory station 110 and a container cleaning chamber 120.

The container cleaning preparatory station 110 has a container moving/loading area S1 having container mounting tables 131 and 132 on which the container 40 are moved and on which the container 40 is placed and a cassette temporary placing area S2 which is disposed below the area S1 and partitioned by a partition table 133. Automatic article carry-in/out units 140A and 140B, which are the same shapes as the automatic article delivery unit 30, are disposed under the container mounting tables 131 and 132. The container mounting tables 131 and 132 have ports through which the wafer cassette passes and these ports are the same as the port 4 as illustrated in FIG. 4. There is formed holes 134 at the right and left sides of temporary placing portions 136 mounted on partition tables 135 in the cassette temporary area S2 and the elevator table 31 can pass through the holes 134. The elevator table 31 is lowered through the port 134 until the upper surface thereof is flush with the surface of the temporary placing portion 136 and is raised through the port 134.

Ultrapure clean fluid flows in the cassette temporary placing area S2 of the container cleaning preparatory station 110 through a highpure clean air supply unit 150 from the rear wall of the wafer storage unit 10 toward the stacker crane 20. Denoted at 151 is an ordinary filter, 152 is a high-performance filter and 153 is a fan.

Figure 21:
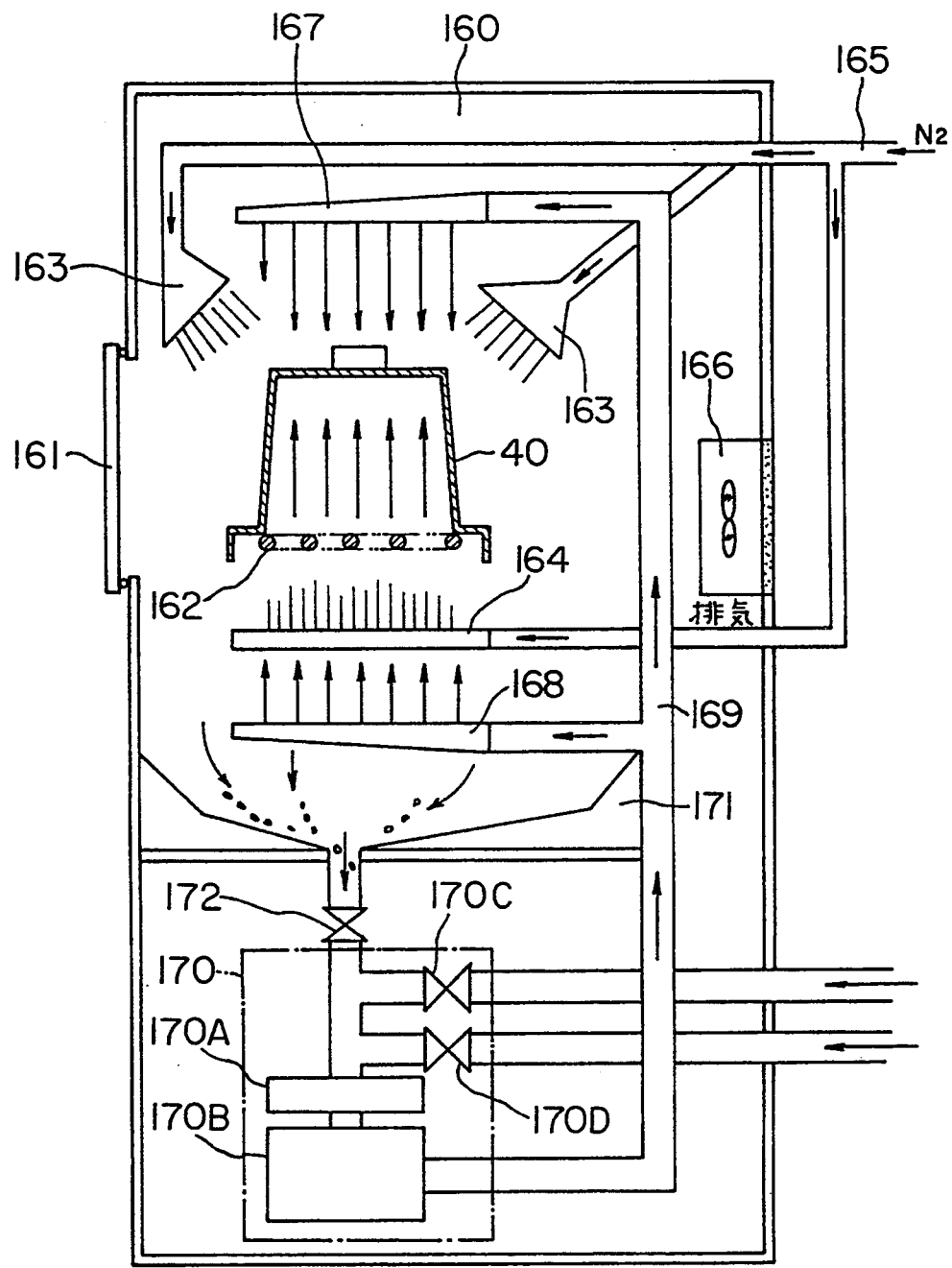
FIG. 21 is a view showing a container cleaning station according to the wafer storage house of FIG. 18.

The container cleaning station 120 has a cleaning chamber 160 as illustrated in FIG. 21. In FIG. 21, denoted 161 is a closing type automatic door. Denoted at 162 is a container mounting table which is shaped as a basket rack or a rack formed of pipes, 163 are upper dry gas jetting portions having plural jetting nozzles directed downward and are disposed at the position adjacent to a ceiling of the cleaning chamber 160 and 164 is a lower dry gas jetting portion having plural jetting nozzles directed upward and is disposed under the container mounting table 162. Highpure air or N₂ gas which is passed through the filter is used as the dry gas. Denoted at 166 is a discharge unit. Denoted at 167 is an upper cleaning liquid jetting portion having plural jetting nozzles directed downward and is disposed at the position adjacent to the ceiling of the cleaning chamber 160 and 168 is a lower cleaning liquid jetting portion having plural jetting nozzles directed upward and is disposed under the container mounting table 162. Both the jetting portions 167 and 168 are connected to a liquid supply unit 170 disposed at the lower portion of the cleaning chamber 160 through a pipe 169. The liquid supply unit 170 has a filter 170A and a circulating pump 170B and is connected to a cleaning liquid tank and a pure water tank, which are not shown but disposed outside the wafer storage unit 10, by way of closing valves 170C and 170D. Cleaning liquid dropped in a funnel-shaped liquid collector 171 is introduced into the liquid supply unit 170 by way of a closing valve 172. Detergent or pure water, mixture of the detergent and pure water are used as the cleaning liquid.

Other elements of the wafer storage house of the seventh embodiment is the same as those of the wafer storage house of the first embodiment, hence these elements have the same numerals as those of the first embodiment and the explanation thereof is omitted.

With the arrangement of the seventh embodiment, the container 40 which is necessary to be cleaned is moved from the storage section S to the container mounting table 131 of the container cleaning preparatory station 110 by the stacker crane 20 and placed on the container mounting table 131. Successively, the following steps are taken.

(1) If the container 40 is moved to and placed on the container mounting table 131, the automatic article carry-in/out unit 140A operates so that the container body 41 is unlocked from the container cover 42 and the elevator table 31 is lowered whereby the wafer cassette W in the container 40 is taken out from the container 40 to the cassette temporary placing area S2. At this time, the container cover 42 is positioned so as be exposed to the ultrapure gas which is passed through the highpure clean air supply unit 150.

(2) The wafer cassette W which is taken out to the cassette temporary placing area S2 is moved to and placed on the cassette temporary placing portion 136, which is adjacent to the hole 64 by the stacker crane 20.

(3) Successively, the automatic door 161 of the cleaning chamber 16C is open so that the container body 41 of the empty container 40 is moved and placed on the container mounting table 162 of the cleaning chamber 160 by the stacker crane 20 and thereafter the automatic door 161 is closed.

(4) The outer and inner surfaces of the container body 41 are sprayed by cleaning liquid in the cleaning chamber 160 during a give time so that the container body 41 is cleaned. Thereafter, the outer and inner surfaces of the container body 41 are sprayed by the dry gas during a give time so that the container 40 is dried.

(5) The dried container body 41 is carried out from the cleaning chamber 160 and moved to and placed on the container mounting table 131 by the stacker crane 20.

(6) The wafer cassette W placed on the cassette temporary portion 136 is moved to and placed on the container cover 42 which remains lowered to the cassette temporary placing area S2.

(7) After the wafer cassette W is placed on the container cover the elevator table 31 of the automatic article carry-in/out unit 140A is raised while placing the container cover 42 and the wafer cassette W thereon so that the container cover 42 is positioned in the opening of the container body 41 and the container body 41 is locked by the container cover 42.

(8) After the container body 41 is locked, the container 40 is moved to and placed on the original storage section S.

The container cover 42 is cleaned by the ultrapure gas which flows to the cassette temporary placing area S2 while the container body 41 is cleaned and dried in the cleaning chamber 160. The container cover 42 can be cleaned utilizing high-pressure air or N₂ gas which are used in a drying step.

A control unit, not shown, of the stacker crane 20 controls the container 40 by monitoring whether the container 40 is empty or not and in which storage section the container 40 is stored utilizing an ID code attached to the container body 41 and it also controls the cleaning history of the container 40. It is a matter of course that the cleaning history of the container 40 can be controlled without utilizing the ID code if the container 40 is of a closing system, namely, it is used only in the wafer storage house or if the container is controlled by a host computer.

Since the wafer cassette W remains placed in the cassette temporary placing area S2 until the container body 41 of the container 40 is cleaned, even if a carry-out instruction of the wafer cassette is issued from the host computer to the control unit of the stacker crane 20 during the time, the wafer cassette W can not be carried out from the container body 41. To prevent this, there are provided the container mounting table 132 and the automatic article carry-in/out unit 140B. In this case, the empty container is moved to the container mounting table 132 and the wafer cassette W which is taken out from the container on the container mounting table 131 to the cassette temporary area S2 is moved to the container cover 42 on the elevator table 31 of the automatic article carry-in/out unit 140B by the stacker crane 20 and placed thereon and thereafter it is accommodated in the cleaned container.

According to the seventh embodiment, the container is moved between the cleaning chamber 160 and the container mounting tables 131 and 132 by the stacker crane 20, it can be moved by an exclusive moving/loading robot which is provided instead of the stacker crane 20.

Although the outer and inner surfaces of the container body 41 of the container 40 is cleaned in the cleaning chamber 160, the inner surface of the container body 41 can be cleaned in a simplified cleaning unit which is provided instead of the cleaning chamber 140.

Figure 22:
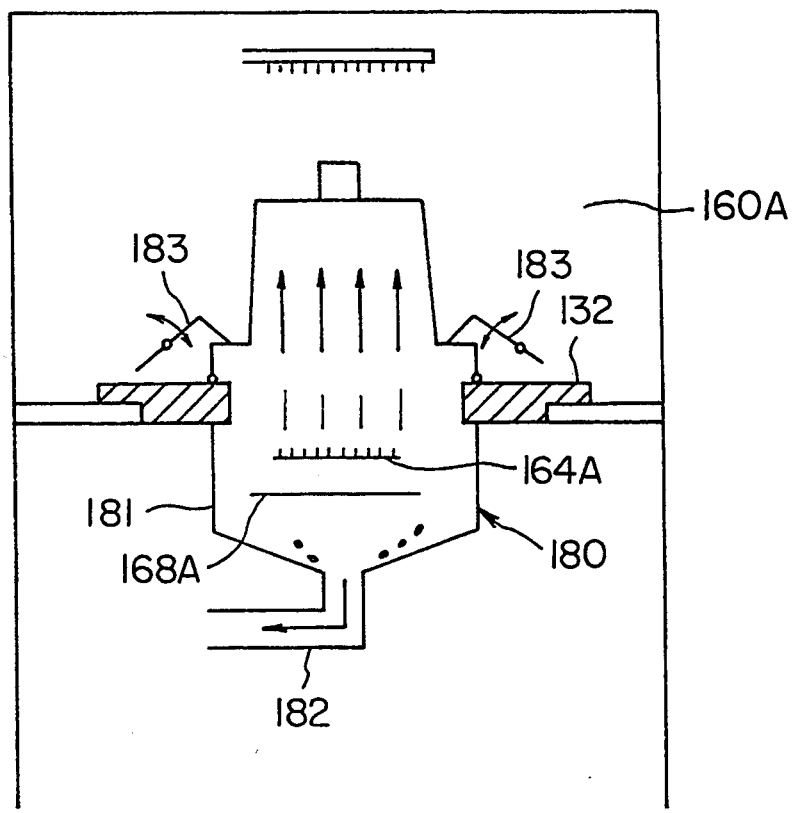
FIG. 22 is a view showing a simplified container cleaning unit according to the wafer storage house of FIG. 18.
Figure 23:
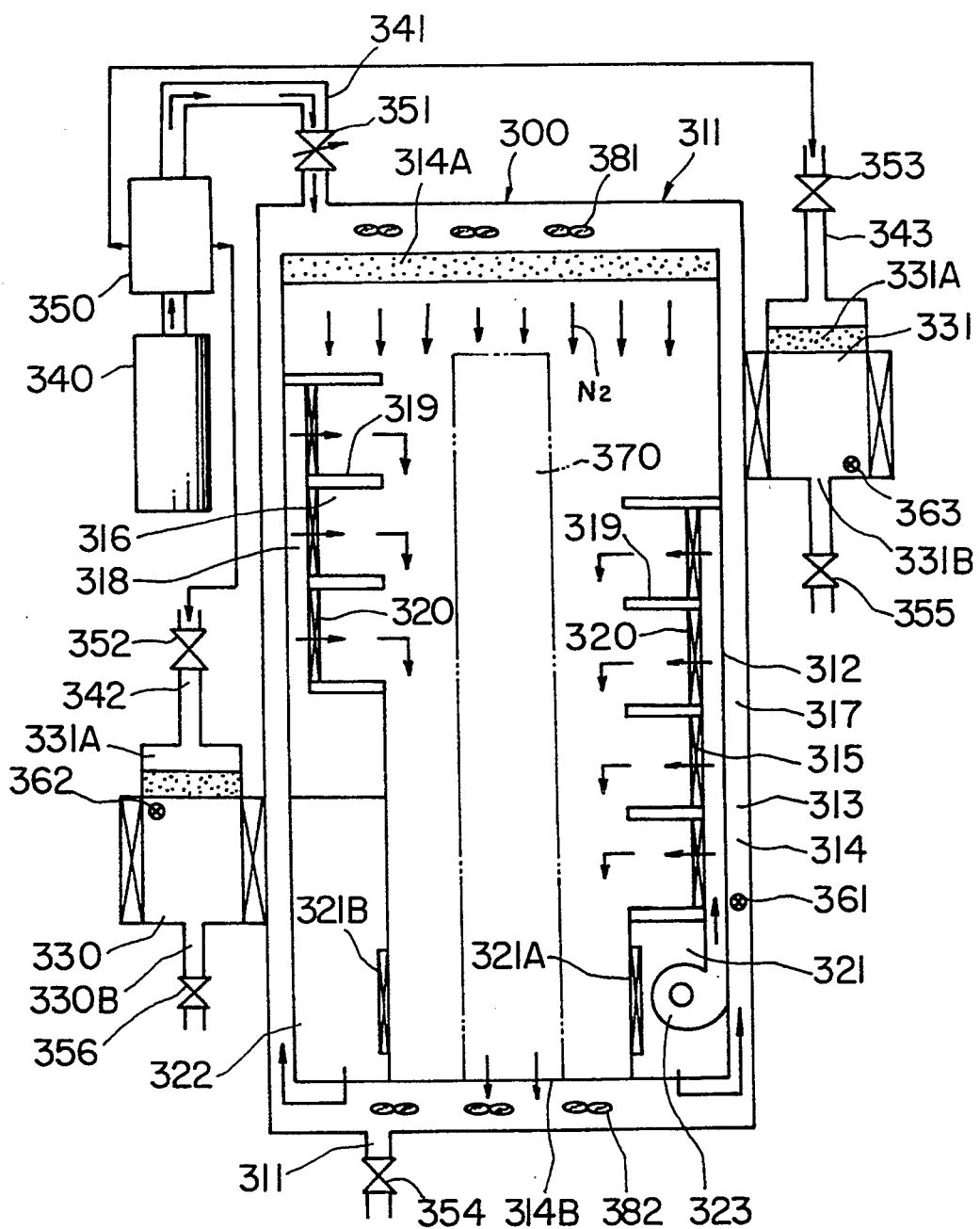
FIG. 23 is a longitudinal cross-sectional view of a conventional wafer storage house.
Figure 24:
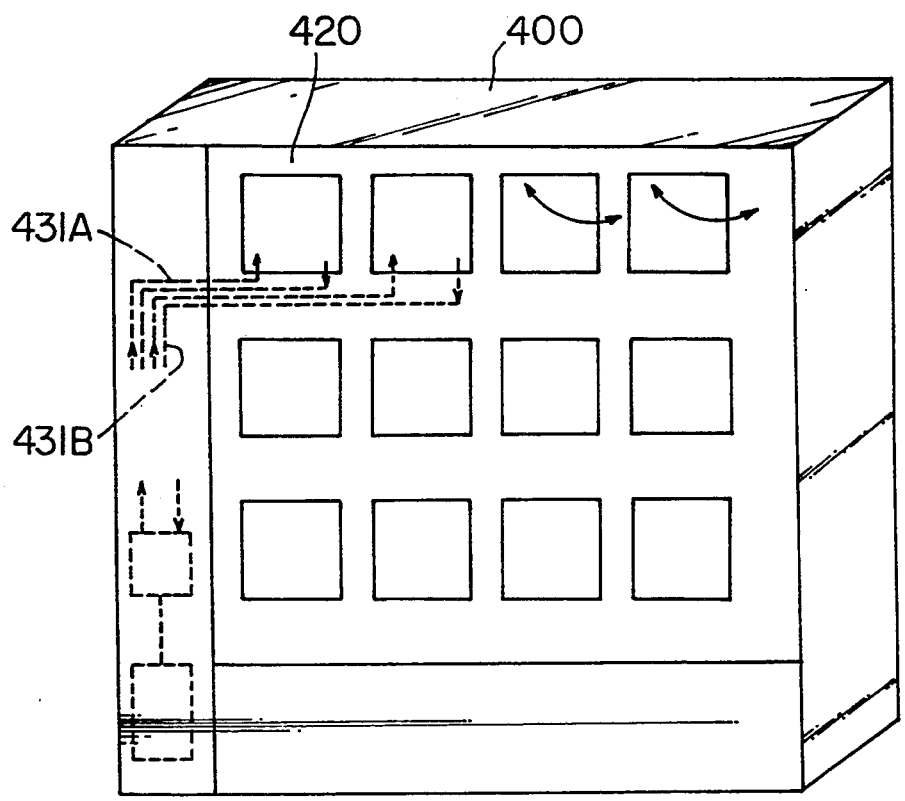
FIG. 24 is a perspective view of a wafer storage unit of the wafer storage house of FIG. 23.
Figure 25:
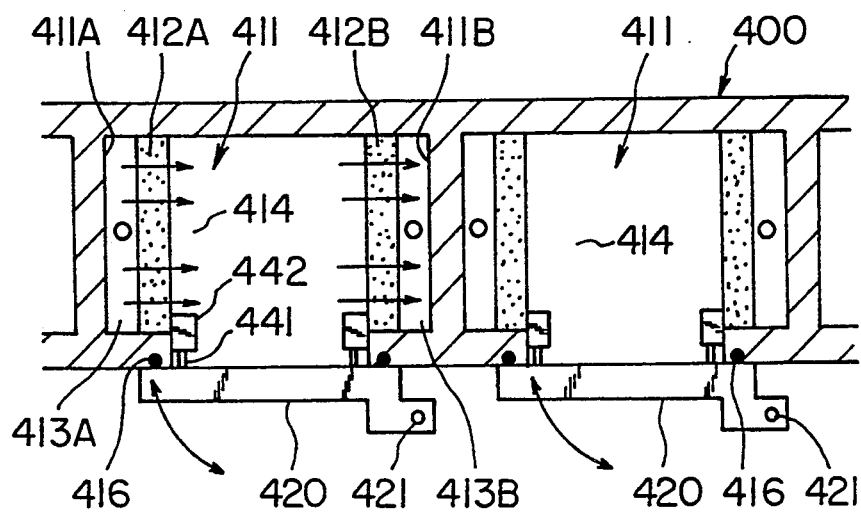
FIG. 25 is a cross-sectional view of the wafer storage unit of FIG. 24 wherein a part thereof is cut off.
Figure 26:
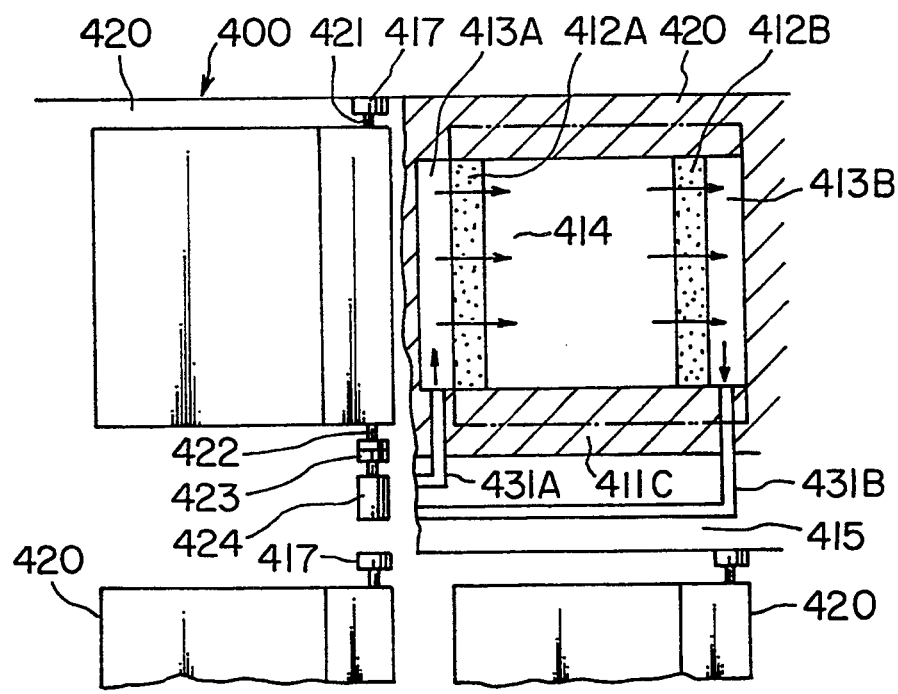
FIG. 26 is a cross-sectional view of another example of the wafer storage unit of FIG. 24 wherein a part thereof is cut off.
Figure 27:
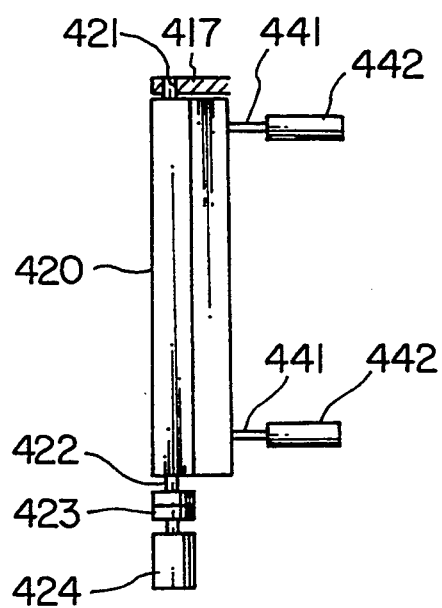
FIG. 27 is a view showing a part of the wafer storage unit of FIG. 24.
Figure 28:
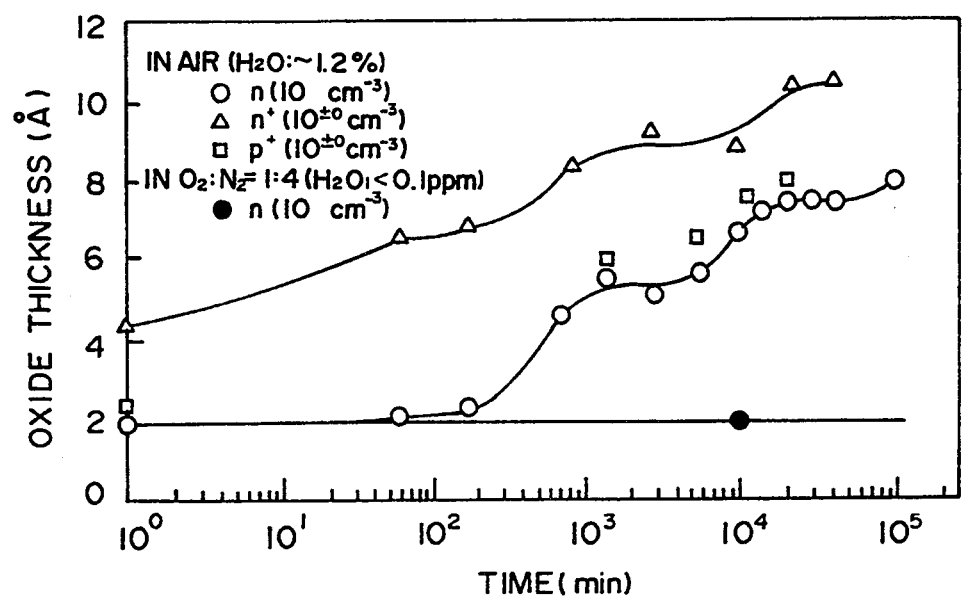
FIG. 28 is a view showing the relation between the thickness of art oxide film and the time involved in the formation of the oxide film which is formed by the natural oxidation of the silicon semiconductor wafer.
Figure 29:
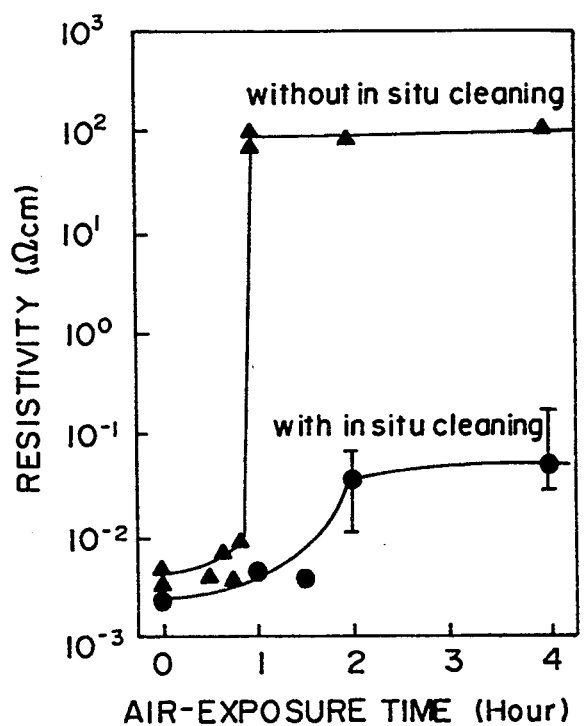
FIG. 29 is a view showing the relation of the resistivity of the silicon semiconductor wafer and an air-exposure time when the silicon semiconductor wafer is exposed to the atmosphere so that the natural oxide film is formed thereon and is subjected to an epitaxial growth.

FIG. 22 shows an example of the simplified cleaning unit 180 which utilizes the part of the cleaning preparatory station 110 as a cleaning portion 160A. The simplified cleaning unit 180 is airtightly attached to the container mounting table 132. A container body 181 of the container 180 comprises a cylindrical body which is open at the upper portion thereof and reversely conical at the lower portion thereof so as to be decreased in the diameter thereof toward the bottom thereof. A liquid pipe 182 extends from the central bottom of the container body 181. The liquid pipe 182 is connected to a liquid supply unit, not shown, like the liquid supply unit 170 as illustrated in FIG. 21. A cleaning liquid jetting portion 168A and a dry gas jetting portion 164A respectively having a plurality of upper directed nozzles are disposed under the container body 181. The cleaning liquid is supplied from the liquid supply unit disposed outside the wafer storage unit to the cleaning liquid jetting portion 168A. The dry gas jetting portion 164A is connected to a gas supply unit disposed outside the wafer storage unit through the pipe 182.

With the arrangement of the simplified cleaning unit, followed the step (2) as set forth above, the container body 41 of the empty container 40 is moved to the container mounting table 132 in the cleaning chamber 160A by the stacker crane 20 and it is airtightly fixed to the container mounting table 132 by a fixing member 183 whereby the inner surface of the container body 41 can be cleaned in the simplified cleaning unit 180.

In the seventh embodiment, the N₂ gas purge can be performed in the cassette temporary placing area S2 if the container, in which N₂ gas purge is performed, is used.

As mentioned above in detail, since there is provided the automatic container cleaning portion capable of cleaning the container automatically in the wafer storage house wherein the wafer cassette is stored in the airtight container body but not stored wafer in the naked state, the contamination caused by the contamination of the container can be prevented and the advantage of the storage house, wherein the airtight container stores therein the wafer cassette, can be achieved fully.

What is claimed is:

1. An article storage house in a clean room, comprising: storage units having storage sections; and a moving/loading unit having a moving/loading mechanism for carrying a storage article in the storage section or carrying the storage article from the storage section; wherein the storage article to be carried in and out from the storage section is a container which accommodates airtightly therein an article that should not be contaminated by a particle of dust or by chemicals; wherein one or a plurality of the storage sections have inert gas purge mechanisms; including a re-purge station;

wherein the re-purge station is disposed in the article carry-in/out portion and includes a plate having a port through which the article can pass, a gas supply port and a gas discharge port through which the inert gas is respectively supplied and discharged, an elevator table having a cover serving to close the port, and a mechanism attached to the plate for airtightly closing the port cooperating with the container; and wherein the inert gas purge mechanism has an unlocking mechanism for unlocking the container cover from the container.

2. An article storage house in a clean room, comprising: storage units having storage sections; and a moving/loading unit having a moving/loading mechanism for carrying a storage article in the storage section or carrying the storage article from the storage section; wherein the storage article to be carried in and out from the storage section is a container which accommodates airtightly therein an article that should not be contaminated by a particle of dust or by chemicals; including an article carry-in/out portion of the wafer storage house to which the article is carried in or from which the article is carried out, said article carry-in/out portion being composed of a container moving/loading portion and an automatic article delivery unit; wherein an empty container or the container storing therein the article is moved from the storage section to the container moving/loading portion and the article is carried in or carried out from the container by the automatic article delivery unit; wherein the container can be airtightly sealed by a container cover having a lock mechanism for locking the container; wherein the automatic article carry-in/out unit has an unlocking mechanism for unlocking the lock mechanism; wherein the article carry-in/out portion has therein an inert gas purge mechanism for replacing air in the container by gas when the article, which is carried in the article carry-in/out portion, is carried in or carried out from the container; and wherein the inert gas purge mechanism disposed in the article carry-in/out portion or storage section includes means for carrying out gas re-purge.

3. An article storage house in a clean room, comprising: storage units having storage sections; and a moving/loading unit having a moving/loading mechanism for carrying a storage article in the storage section or carrying the storage article from the storage section; wherein the storage article to be carried in and out from the storage section is a container which accommodates airtightly therein an article that should not be contaminated by a particle of dust or by chemicals; and including an article carry-in/out portion which is in a highly clean atmosphere.

4. An article storage house according to claim 3 further comprising a unit which automatically carries the article in the container or carries the article from the container.

5. An article storage house according to claim 3, wherein said article carry-in/out portion includes a container moving/loading portion and an automatic article delivery unit; wherein an empty container or the container storing therein the article is moved from the storage section to the container moving/loading portion and the article is carried in or carried out from the container by the automatic article delivery unit; wherein the container can be airtightly sealed by a container cover having a lock mechanism for locking the container; and wherein the automatic article carry-in/out unit has an unlocking mechanism for unlocking the lock mechanism.

6. An article storage house according to claim 5, wherein the container can be airtightly sealed by the container cover having the lock mechanism for locking the container; wherein the automatic article delivery unit has the unlocking mechanism for unlocking the lock mechanism and an elevator table having a cover; and wherein the article is carried in and placed on the container cover from the outside of the article storage house.

7. An article storage house according to claim 5, wherein the article carrying/out portion has therein an inert gas purge mechanism for replacing air in the container by gas when the article, which is carried in the article carry-in/out portion, is carried in or carried out from the container.

8. An article storage house according to claim 6, wherein the inert gas mechanism is disposed in the container moving/loading portion and has a port through which the stored article can be passed, a plate having a gas supply port and a gas discharge port through which gas is respectively supplied or discharged, and a mechanism capable of airtightly closing the port cooperating with the container on the automatic article delivery unit and capable of being raised or lowered together with the elevator table.

9. An article storage house according to claim 3, wherein one or a plurality of said storage sections have inert gas purge mechanisms.

10. An article storage house according to claim 9, wherein the inert gas purge mechanism is disposed in the storage section and has the port through which the storage article can pass, a plate having a gas supply port and a gas discharge port through which the gas is respectively supplied and discharged, an elevator unit equipped with the elevator table, and a mechanism attached to the plate for airtightly closing the port cooperating with the container; and wherein the inert gas purge mechanism has a lock closing mechanism for unlocking the lock mechanism of the container cover.

11. An article storage house according to claim 9, further comprising a re-purge station.

12. An article storage house according to claim 3, wherein a container moving/loading portion of the article carry-in/out portion has a container carry-in/out portion.

13. An article storage house in a clean room, comprising: a single or a plurality of storage units; a self-advancing moving/loading unit having a moving/loading mechanism which is mounted thereon for carrying a stored article in or for carrying the stored article from each storage section of the storage unit, the stored article being a container for airtightly accommodating therein an article which should not be contaminated by a particle of dust or chemicals; and an automatic container cleaning portion; wherein an article temporary placing area of a container cleaning preparatory station is in a highly clean atmosphere or an inert gas atmosphere.

14. An article storage house in a clean room, comprising: a single or a plurality of storage units; a self-advancing moving/loading unit having a moving/loading mechanism which is mounted thereon for carrying a stored article in or for carrying the stored article from each storage section of the storage unit, the stored article being a container for airtightly accommodating therein an article which should not be contaminated by a particle of dust or chemicals; and an automatic container cleaning portion; including a unit for automatically carrying the article in and out from the container; wherein the automatic container cleaning portion includes a container cleaning preparatory station having a mechanism for carrying the article in or out from the container and a cleaning chamber for subjecting an empty container, which is moved from the container cleaning preparatory station or the storage section, to a cleaning liquid; and wherein the self-advancing moving/loading unit moves the empty container.

15. An article storage house according to claim 14, wherein the container cleaning preparatory station has a container moving/loading area and an article temporary placing area.

16. An article storage hours according to claim 13, further including a unit form automatically carrying the article in and out from the container.

17. An article storage house according to claim 15, wherein one or a plurality of container mounting tables of the container moving/loading area of the container cleaning preparatory station have ports, and wherein the automatic article delivery mechanism has an elevator table having a cover serving for closing the port and an unlocking mechanism for unlocking the container cover from the container.

18. An article storage house according to claim 17, wherein any of the plurality of container mounting tables is a container moving/loading table to which the cleaned container is moved; and wherein the article, which is taken out from the container which is not cleaned and placed on the other container mounting tables, is transferred to said container mounting table.

19. An article storage house in a clean room, comprising: a single or a plurality of storage units; a self-advancing moving/loading unit having a moving/loading mechanism which is mounted thereon for carrying a stored article in or for carrying the stored article from each storage section of the storage unit, the stored article being a container for airtightly accommodating therein an article which should not be contaminated by a particle of dust or chemicals; and an automatic container cleaning portion; wherein a cleaning chamber of a container cleaning preparatory station has a cleaning liquid jetting system and a dry gas jetting system.

20. An article storage house in a clean room, comprising: a single or a plurality of storage units; a self-advancing moving/loading unit having a moving/loading mechanism which is mounted thereon for carrying a stored article in or for carrying the stored article from each storage section of the storage unit, the stored article being a container for airtightly accommodating therein an article which should not be contaminated by a particle of dust or chemicals; and an automatic container cleaning portion; wherein any of a plurality of container mounting tables is a container moving/loading table to which the cleaned container is moved; wherein the article, which is taken out from the container that is not cleaned and placed on the other container mounting tables, is transferred to said container mounting table; and including means in the article temporary placing area of the container cleaning preparatory station for cleaning the container cover of the container by gas.

21. An article storage house according to claim 13, wherein the container has an ID code which controls the cleaning history of the container.

* * * * *

UNITED STATES PATENT AND TRADEMARK OFFICE
CERTIFICATE OF CORRECTION

PATENT NO. : 5,363,867
DATED : November 15, 1994
INVENTOR(S) : Hitoshi KAWANO et al It is certified that error appears in the above-indentified patent and that said Letters Patent is hereby corrected as shown below:

Col. 20, Claim 7, line 11; change "carrying/out" to ---carry-in/out---.

Col. 21, Claim 16, line 15; change "form" to ---for---.

Signed and Sealed this

Twenty-first Day of February, 1995

Attest:

BRUCE LEHMAN

Attesting Officer

Commissioner of Patents and Trademarks